United States Patent [19]

Okabe

[11] Patent Number: 5,602,406
[45] Date of Patent: Feb. 11, 1997

[54] SEMICONDUCTOR INTEGRATED CIRCUIT DEVICE WITH REDUCED CLOCK SIGNAL LINE NOISE

[75] Inventor: Masatomi Okabe, Itami, Japan

[73] Assignee: Mitsubishi Denki Kabushiki Kaisha, Tokyo, Japan

[21] Appl. No.: 517,193

[22] Filed: Aug. 21, 1995

Related U.S. Application Data

[63] Continuation of Ser. No. 102,198, Aug. 5, 1993, abandoned.

[30]     Foreign Application Priority Data

Aug. 26, 1992   [JP]   Japan ..................... 4-226756

[51] Int. Cl.$^6$ .......................... H01L 27/10; H01L 23/552
[52] U.S. Cl. .................... 287/207; 257/208; 257/210; 257/211; 257/659; 257/202
[58] Field of Search ................... 257/202, 207, 257/208, 210, 211, 659

[56]     References Cited

U.S. PATENT DOCUMENTS 4,870,300   9/1989   Nakaya et al. ..................... 257/207

FOREIGN PATENT DOCUMENTS 1-41032   9/1989   Japan ..................... 257/207

OTHER PUBLICATIONS

IEEE 1989 Custom Integrated Circuits Conference, C. NG, et al., "A Hierarchical Floor–Planning, Placement, and Routing Tool for Sea–Of–Gates Designs", pp. 3.3.1–3.3.4.

L. Wakeman, "Vorgange auf Leitungen und Ihr Einfluss auf HCMOS–Schaltkreise", Der Elektroniker, No. 3, 1986, pp. 57–63.

*Primary Examiner*—Steven H. Loke
*Attorney, Agent, or Firm*—Oblon, Spivak, McClelland, Maier & Neustadt, P.C.

[57]     ABSTRACT

It is an object of the present invention to design in a short period of time a semiconductor integrated circuit device capable of stable operation with high noise margin by reducing effects of noise caused by coupling capacitance between clock signal lines and other signal lines in a semiconductor integrated circuit device with a finer structure. A macro-cell (1a) used in designing with a Computer Aided Design system has a structure in which a clock signal line (6) is interposed and shielded between $V_{DD}$ power-supply lines (4 and 4a). By using such a basic macro-cell (1a) with the shielded clock signal line (6), coupling capacitance can always be reduced between the clock signal lines and other signal lines formed in interconnection spaces even when using the Computer Aided Design.

18 Claims, 29 Drawing Sheets

5,602,406

SEMICONDUCTOR INTEGRATED CIRCUIT DEVICE WITH REDUCED CLOCK SIGNAL LINE NOISE

This application is a continuation of application Ser. No. 08/102,198, filed on Aug. 5, 1993, now abandoned.

BACKGROUND OF THE INVENTION

1. Field of the Invention

The present invention relates to technique of providing semiconductor integrated circuit devices with interconnections, and more particularly, to routing of interconnections technique in which noise of clock signals occurring on a clock signal line is reduced.

2. Description of the Background Art

FIG. 12 is a flow chart showing one example of a design flow for semiconductor integrated circuit devices. Generally, in the semi-custom methods using gate arrays and the like, designing methods are standardize and designing procedures are mostly performed automatically with computers. For gate arrays, for example, substrates having basic cells such as transistors regularly arranged (master chips) are produced in advanced and interconnecting procedures only are performed with CAD (Computer Aided Design) or the like by freely laying out patterns of interconnection layers for customizing in a short period of time.

FIG. 13 shows one example of a CAD systems used for the design flow described above. This system was developed for SOG (Sea of Gates) applications. In FIG. 13, T1–T11 denote various kinds of tools, respectively. Simulation, verification, conversion of data, layout and the like are automatically accomplished by those tools on the basis of data in the integrated data base.

First, information such as logic connections based on logic circuit diagrams and timing charts provided by a user (Step S1) is inputted as design data into the data base of the CAD system with logic input tools T1 and T2 (Step S2).

Next, logic verification is performed with the logic simulation tool T4 and the like using a test pattern generated from the timing charts and the like in order to verify the correctness of the logic circuits presented by the user (Step S3). If it does not operate normally (NG), the design is modified. If normal operation is confirmed, timing verification is further performed with the timing verification tool T5 using virtual interconnection lengths (Step S4). When the timing verification is completed, the processing proceeds to the step of placing and interconnecting cells on a selected master chip. The placing and interconnecting are automatically accomplished by the layout tool T11 with libraries of various kinds of cells entered in the design data base DB1 (Step S5). In the case of gate arrays, connections may not be completely made by the automatic placement and routing if the utilization ratio of gates of the master chip is high because the chip size is defined. Accordingly, routing programs and art work data may be modified by hand with the conversational art work editor. When the automatic placement and routing is finished, the interconnection lengths are precisely determined (Step S6), and timing verification is implemented using the same (Step S7). If an error occurs in the results of the final verification of operational timing, the logic circuit or the timing chart may be modified. Next, if normal operation is confirmed in the timing verification, it is converted into an actual pattern, and a mask for forming interconnections is made using the same (Step S8). The test pattern generated from the timing charts presented by the user is used for the logic and the timing verifications, and is also converted into the format for a tester for testing semiconductor integrated circuit devices using the test generation tool T6 and the like (Step S9). Wafers completed via the interconnection forming process with the masks are tested with the test pattern, and the procedure proceeds toward final products. In FIG. 12, the dotted lines represent the CAD system and relations of use of the CAD system.

Next, the automatic placement and routing will be described in detail referring to FIGS. 14–24. FIG. 14 is a plan view showing one example of structure of a master chip selected after the timing verification (Step S4), shown in FIG. 12, is finished. In the figure, reference numeral 50 designates a master chip of a gate array LSI, 52 denotes I/O buffer regions in the periphery of the LSI used to input/output signals, 53 denotes an internal gate region in which internal gates are arranged, 54 denotes predriver cells including predrivers for outputting clock signals provided around the internal gate region 53, and 55 denotes maindriver cells including maindrivers for outputting and distributing clock signals to the internal gate region 53 provided around the internal gate region 53. The internal gate region 53 can be divided into a plurality of unit areas, and one of the unit areas is shown in FIG. 15. FIG. 15 is an enlarged plan view of a unit region Ar2. In the figure, reference numeral 2 designates gate electrodes of PMOS transistors, 2a denotes an $N^+$ diffusion layer forming a series of PMOS transistors, 3 denotes gate electrodes of NMOS transistors, and 3a denotes a $P^+$ diffusion layer forming a series of NMOS transistors. The arrow in the upper left side of the figure indicates one unit of basic cell.

Next, FIGS. 16 and 17 show slice cells for realizing supply of two-phase clock signals to the internal gate region 53. FIG. 16 shows a cell used for forming a clock ring for supplying first clock signals CLKA, and FIG. 17 shows a cell used for forming a clock ring for supplying second clock signals CLKB. In FIG. 16, 60 denotes a slice cell including a clock ring, 62 denotes a predriver input line for providing clock signals CLKA applied from outside to inputs of predrivers, 63 denotes a predriver output line for providing outputs of the predrivers to input terminals of maindrivers, and 64a and 64b denote maindriver output lines for providing outputs of the maindrivers to the clock ring. The layout of these interconnections enables selection as to how many predrivers and maindrivers are to be assigned to supply first clock signals CLKA. 61a–61c and 65a, 65b denote Al lines forming the clock ring. 61a–61c represent second layer Al interconnections and 65a, 65b represent first layer Al interconnections, respectively. Structures of clock rings are not limited to this structure. For example, four or more second layer Al lines may be provided, although three second layer Al lines are included in this slice cell. That is, slice cells can be prepared according to different applications. In the same way, in FIG. 17, reference numeral 70 designates a slice cell including a clock ring for supplying second clock signals CLKB, 72 denotes a predriver input line for providing clock signals CLKB which are applied from outside to inputs of predrivers, 73 denotes a predriver output line for providing outputs of the predrivers to input terminals of maindrivers, and 74a and 74b denote maindriver output lines for providing outputs of the maindrivers to the clock ring. In this structure, outputs of three predrivers are commonly applied to inputs of three maindrivers.

FIG. 18 shows the master chip shown in FIG. 14 and the slice cells shown in FIGS. 16 and 17 placed thereon. As can be seen from FIG. 18, since the clock ring for supplying first clock signals CLKA shown in FIG. 16 and the clock ring for supplying second clock signals CLKB shown in FIG. 17 are different in size, clock signal lines are not formed in the same interconnection layer overlapping with each other. The clock rings are placed in the circumferential area of the internal gate region 53, and the clock signal lines 61a and 71a are also placed in the center area thereof. This structure can suppress occurrence of clock skew. Further, interconnections can easily be made so that two-phase clock signals can be effectively supplied to the internal gate region 53 from the circumference thereof.

Subsequently, basic macro-cells are placed and interconnected to realize desired functions. In order to simplify the explanation, description will be given here on relations between the second clock signals CLKB and the macro-cells. FIG. 19 shows a master chip including $V_{DD}$ power-supply lines 76a–78a and GND power-supply lines 76b–78b, with the slice cell shown in FIG. 17 placed thereon. FIG. 20 shows a basic macro-cell. In FIG. 20, reference numeral 4 designates a $V_{DD}$ power-supply line for supplying a potential $V_{DD}$, and 5 denotes a GND power-supply line for supplying a potential GND. The $V_{DD}$ power-supply line 4 is provided in one end area of the cell in parallel with the series of gate electrodes 2 of the PMOS transistors arranged in a line and the GND power-supply line 5 is provided in the other end area of the cell in parallel with the series of gate electrodes 3 of the NMOS transistors arranged in a line.

FIG. 21 shows the master chip shown in FIG. 19 and the basic macro-cells shown in FIG. 20 or the basic macro-cells with interconnections provided therein which are placed on the master chip.

After routings of the clock ring and clock driver cells such as predriver cells and maindriver cells and the like are determined, positionings in internal cell rows, i.e., in which rows in the internal gate region 53 the macro-cells are to be placed, are determined. For example, in the semiconductor integrated circuit device shown in FIG. 21, the macro-cells are placed in the second row, the fifth row and the eighth row. The macro-cells can be classified into sequential circuits 35a which require supply of the second clock signals CLKB and combinational circuits 36a which do not require supply of clock signals. With the macro-cells placed therein, the $V_{DD}$ power-supply lines 4 and the GND power-supply lines 5 are not connected in areas where no macro-cells exist in the internal cell rows, and the $V_{DD}$ power-supply lines 4 and the GND power-supply lines 5 are connected in areas where the macro-cells are connected in a row. After placements of macro-cells in the internal cell rows are accomplished, macro-cells having only power-supply lines 4 and 5 are placed on individual internal cell rows to connect the power supply-lines 4 and 5 in the internal cell rows in which internal cells are placed from the left end to the right end of the internal gate region 53. FIG. 22 shows such macro-cells placed therein. An area Ar3 in FIG. 22 has no transistor connection and, therefor, does not serve as an active circuit. However, the power-supply lines 4 and 5 exist in that area, and therefor the power-supply lines 4 and 5 in that internal cell row are connected from the power-supply line 78a on the left end to the power-supply line 77a on the right end all the way.

Next, a determination is made as to where signal lines are to be drawn in interconnection spaces in which no macro-cells exist, and first layer Al interconnections are provided to distribute clock signals from the clock ring to respective macro-cells. FIG. 23 shows the master chip having interconnections for the second clock signals CLKB provided therein. In FIG. 23, 6 denotes clock signal lines of first layer Al interconnections, 38 denotes clock signal lines of second layer Al interconnections, and 39 denotes through holes for connecting the second layer Al lines 71a–71c forming the clock ring and the clock lines 6.

Finally, interconnections for normal signals other than clock signal lines are placed, as it is shown in FIG. 24. In FIG. 24, reference numeral 40 designates signal lines. Placements of signal lines 40 are implemented using interconnection areas in the internal gate region 53 other than cell rows having macro-cells therein. In areas Ar4 and Ar5 in the internal gate region 53, for example, the signal line 40 and the clock signal line 6 are placed in parallel in a considerably long distance.

Conventional semiconductor integrated circuit devices are structured as described above. In such structures, for example, cross-talk may occur between the signal line 40 and the clock signal line 6 in the areas Ar4 and Ar5 due to capacitance between interconnections. In recent years, as structures of semiconductor integrated circuit devices are becoming finer and finer, the problems caused by cross-talk between interconnections are increasing. If a normal signal is mixed into a clock signal CLKB propagating on the clock signal line 6, it causes noise. On the other hand, if a clock signal CLKB propagating on the clock signal line 6 is mixed into a normal signal propagating on the signal line 40, it serves as noise. For overcoming this problem, it is essential to lay out wiring so that the clock signal line 6 and the signal line 40 do not run in parallel to each other. With automatic placement and routing using the CAD system, however, it is difficult to lay out wiring so that clock signal lines and normal signal lines do not run in parallel with conventional routing tools. Accordingly, modifications by hand are required only in areas in which cross-talk is likely to happen in order to reduce such noises, resulting in time-consuming work for design. Thus, there has been a problem that the advantage of gate arrays, i.e., design can be accomplished in a short period of time, could not be fully put into practice.

SUMMARY OF THE INVENTION

The present invention is directed to a semiconductor integrated circuit device formed by automatically placing and routing at least a part of macro-cells with a CAD system and having a circuit operating with supply of different power-supply potentials and a circuit operating in synchronization with a clock signal; wherein the macro-cell includes a clock signal line formed in a particular interconnection layer of multi-layer interconnections and transmitting the clock signal, and at least a set of power-supply lines for supplying the power-supply potentials formed adjacent to the clock signal line on both sides of the clock signal line in the particular interconnection layer.

Preferably, the set of power-supply lines includes power-supply lines of the same potentials to each other.

Preferably, the semiconductor integrated circuit device according to the present invention further includes a circuit which operates when an inputted signal level changes from a low level to a high level or a circuit which operates when an inputted signal level is at a high level, and the potential of the set of power-supply lines includes power-supply potential on a high potential side.

Preferably, the semiconductor integrated circuit device according to the present invention further includes a circuit which operates when an inputted signal level changes from a high level to a low level or a circuit which operates when an inputted signal level is at a low level, and the potential of the set of power-supply lines includes power-supply potential on a low potential side.

Preferably, the set of power-supply lines includes power-supply lines of different potentials from each other.

In accordance with the semiconductor integrated circuit device of the present invention, when the macro-cells are automatically placed and routed, the clock signal line provided in the macro-cell is shielded from outside of the macro-cell by the power-supply lines, so that coupling capacitance of the clock line and a signal line is small even if any signal line is provided in an interconnection area thereafter, and thus cross-talk is not likely to be caused. Accordingly, in the semiconductor integrated circuit device, interference noise between clock signals and other signals can be reduced, enabling high-speed and stable operations.

As a result, a semiconductor integrated circuit device which can stably operate with high noise margin can be obtained in a short period of time with automatic placement and routing with the CAD system because the clock signal line is shielded from other signal lines.

Furthermore, in accordance with the present invention, the clock signal line is shielded by the power-potential lines of potential on the high potential side, so that the noise changing from the low potential side to the high potential side is not likely to occur as noise of the power-supply lines. Accordingly, a circuit which operates when a level of an inputted signal changes from a low level to a high level, or a circuit which operates when a level of an inputted signal is at a high level is not likely to malfunction.

As a result, a semiconductor integrated circuit device capable of stable operation with high noise margin with respect to a change of power-supply potential in the power-supply lines can be obtained.

Furthermore, in accordance with the present invention, the clock signal line is shielded by power-supply lines at potential on the low potential side, so that noise changing from the high potential side to the low potential side is not likely to be caused as noise on the power-supply lines. Accordingly, malfunctions can be prevented in a circuit which operates when a level of an inputted signal changes from a high level to a low level, or in a circuit which operates when a level of an inputted signal is at a low level.

As a result, a semiconductor integrate circuit device capable of stable operation with high noise margin with respect to a change in power-supply potential of power-supply lines can be obtained.

The present invention is also directed to a designing method using a CAD system for a semiconductor integrated circuit device including a circuit operating with supply of different power-supply potentials and a circuit operating in synchronization with a clock signal; including a step of preparing a macro-cell having a clock signal line formed in a particular interconnection layer of multilayer interconnections and a set of power-supply lines formed adjacent to the clock signal line on both sides of the clock signal line in the particular interconnection layer, and a step of automatically placing and routing the macro-cell.

In accordance with the present invention, in the step of placing and routing the macro-cell, the clock signal line can be automatically placed and routed being shielded from other signal lines with the conventional CAD system without using a special routing program.

As a result, a semiconductor integrated circuit device capable of stable operation with high noise margin can be designed in a short period of time.

An object of the present invention is to provide in a short period of time a semiconductor integrated circuit device capable of operating stably at a high speed with reduced occurrence of noise by avoiding placements of other signal lines adjacent to a clock signal line with the conventional CAD system.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
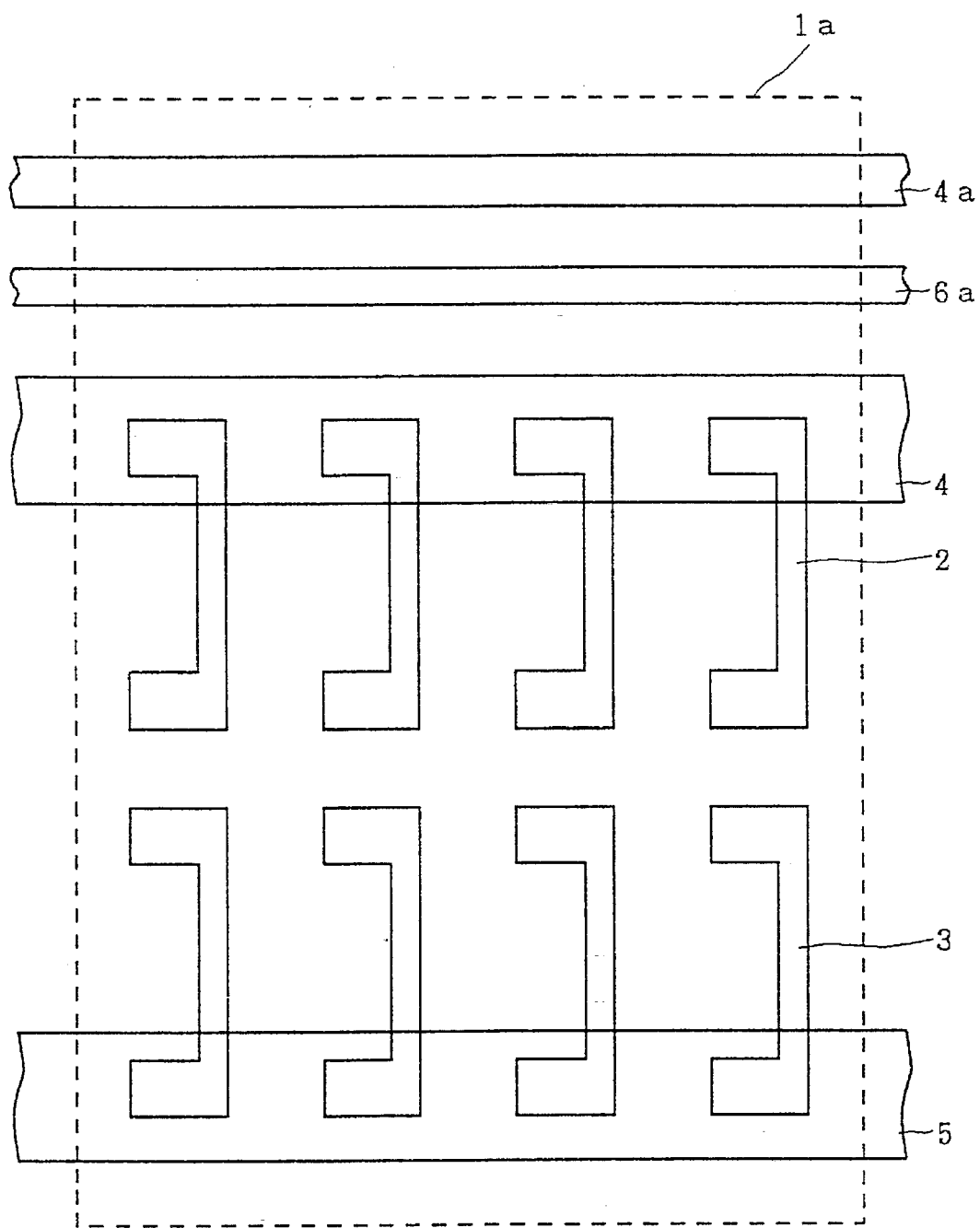
FIG. 1 is a conceptional diagram of a structure of a basic macro-cell of a preferred embodiment according to the present invention.
Figure 20:
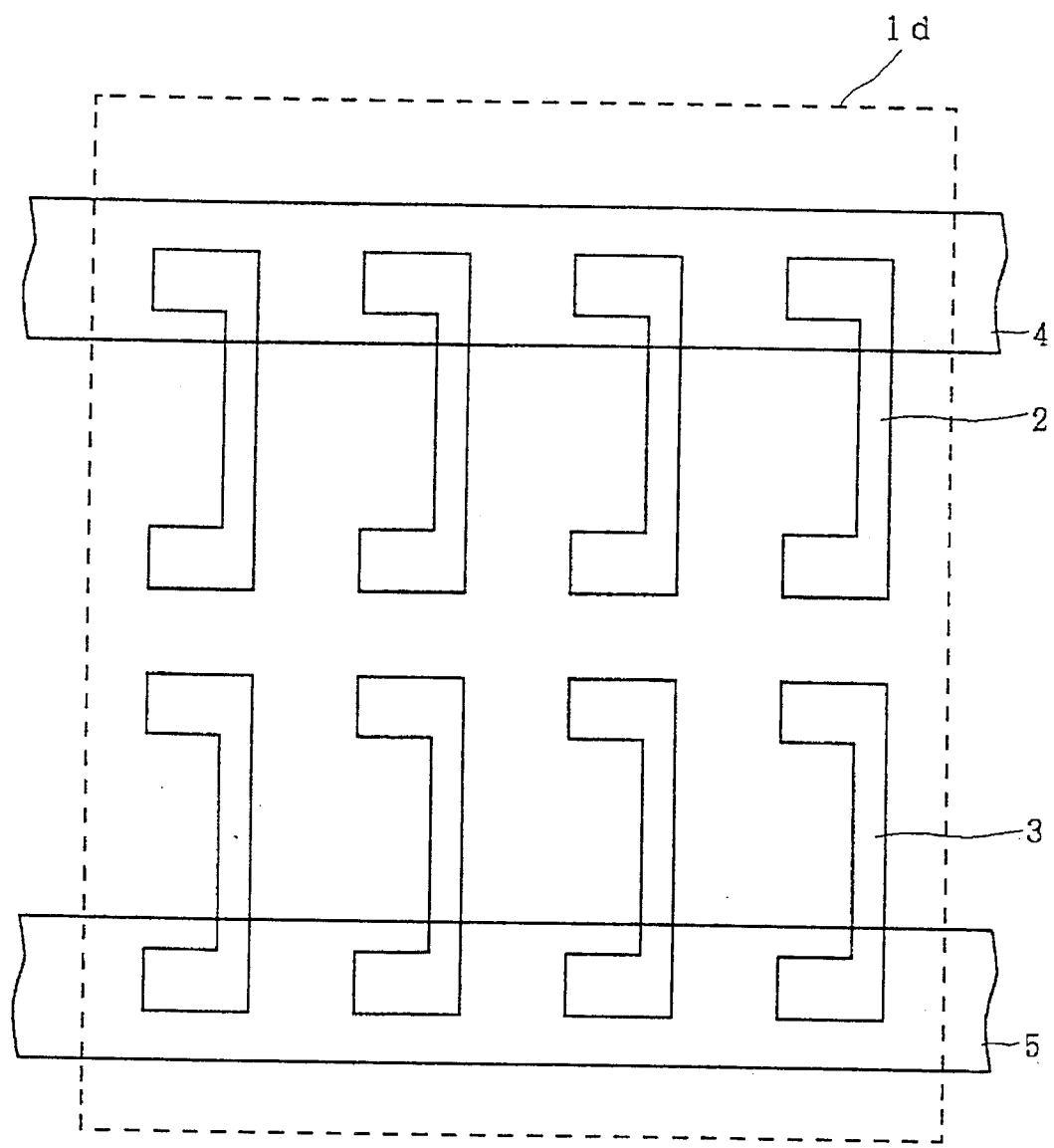
FIG. 20 is a conceptional diagram of a structure of a conventional basic macro-cell.
Figure 21:
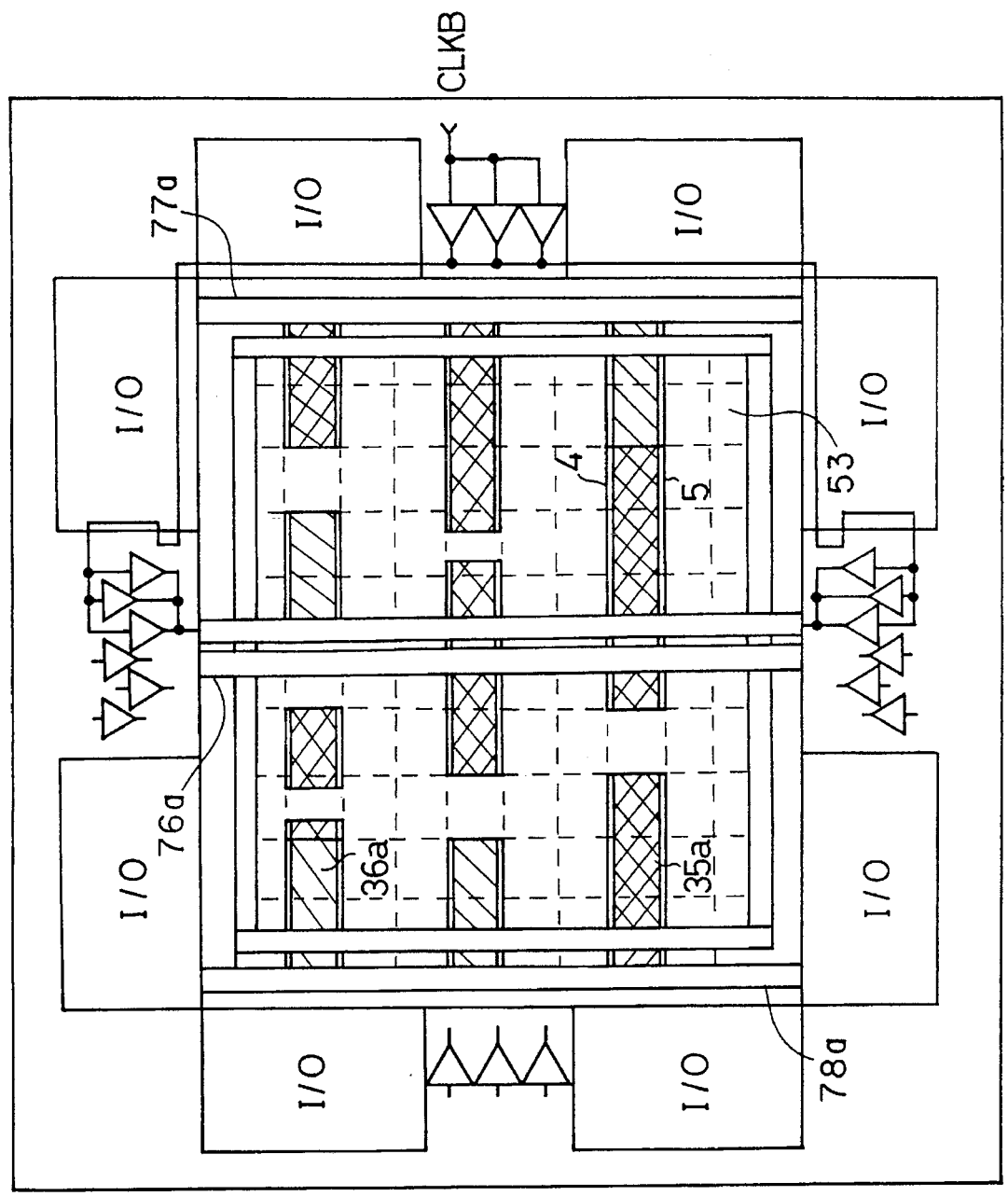
FIG. 21 is a conceptional diagram of a semiconductor integrated circuit device illustrating the master chip shown in FIG. 19 further provided with basic macro-cells.
Figure 22:
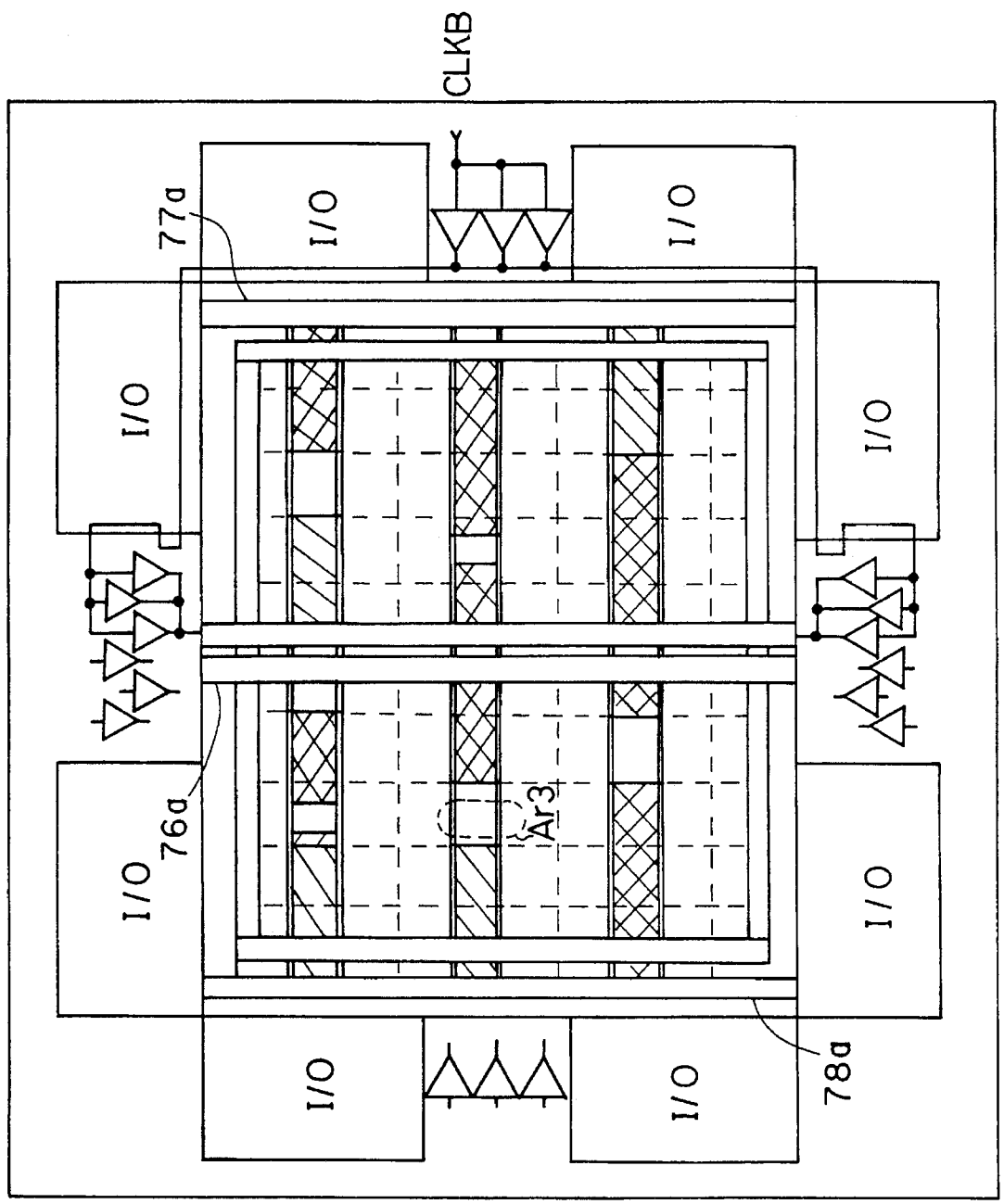
FIG. 22 is a conceptional diagram of a semiconductor integrated circuit device illustrating the master chip shown in FIG. 21 further provided with power-supply lines of the internal cell rows.
Figure 23:
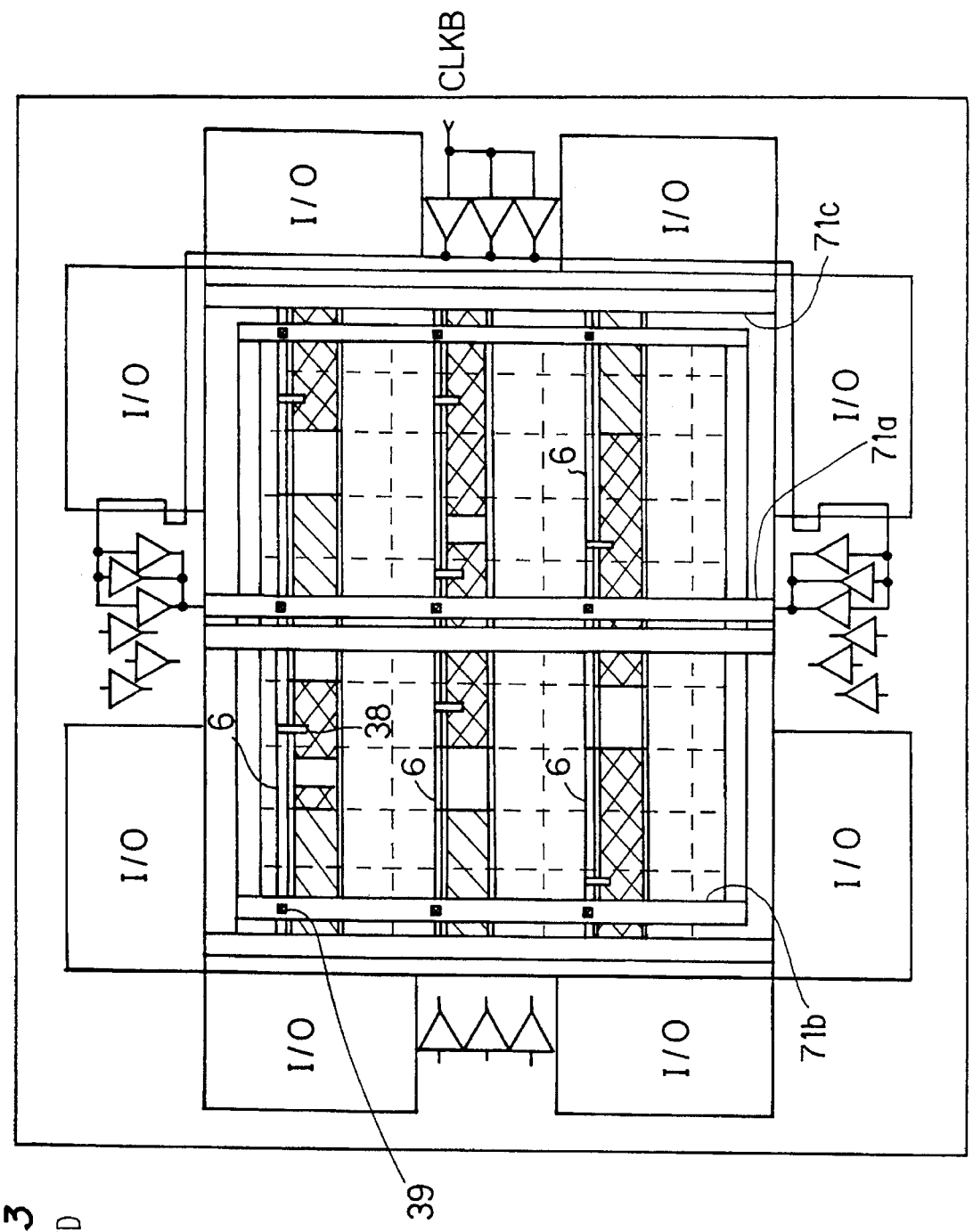
FIG. 23 is a conceptional diagram of a semiconductor integrated circuit device illustrating the master chip shown in FIG. 22 further provided with clock signal lines.
Figure 24:
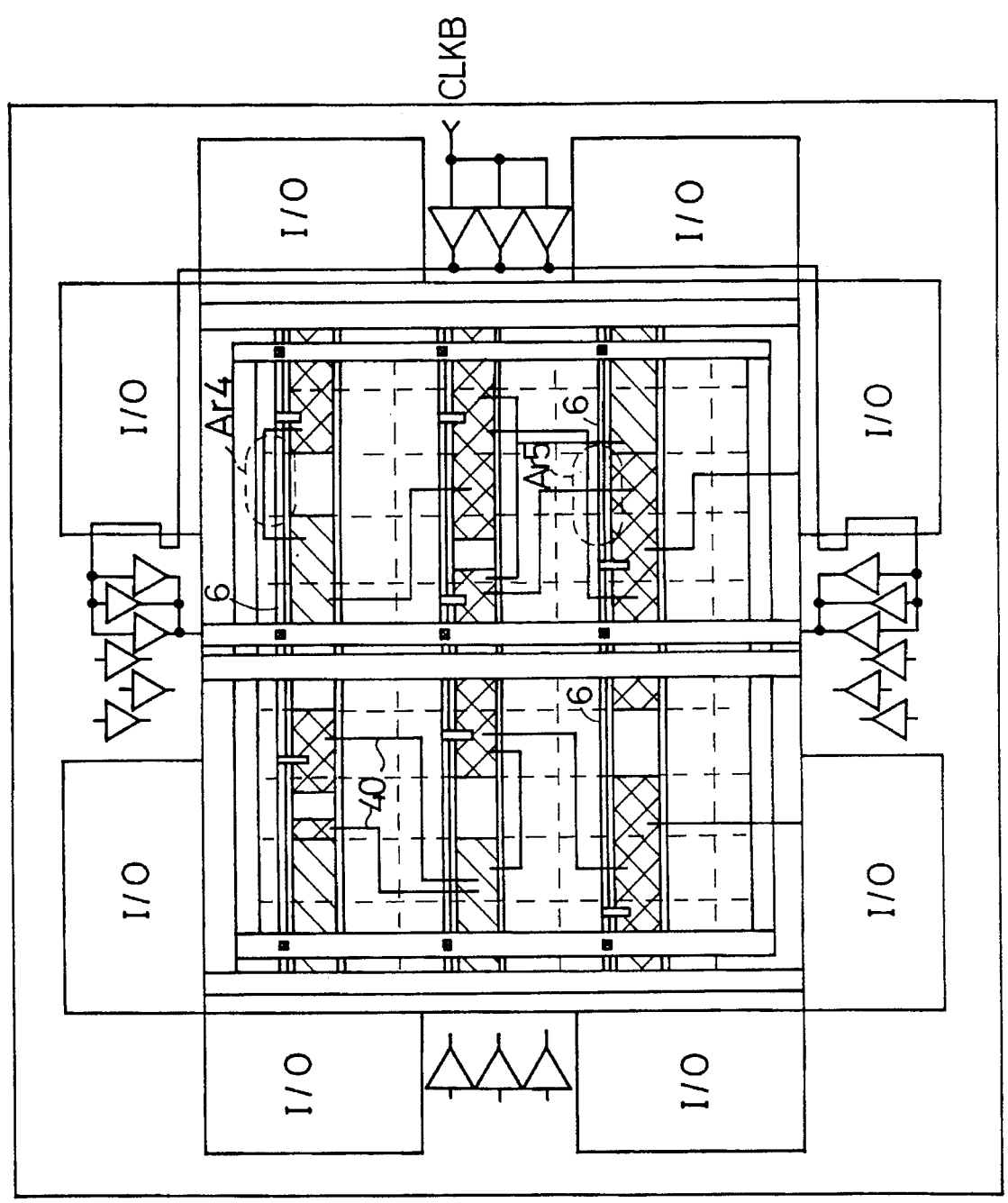
FIG. 24 is a conceptional diagram of a semiconductor integrated circuit device illustrating the master chip shown in FIG. 23 further provided with signal lines.

A preferred embodiment of the present invention will be described below referring the figures. FIG. 1, FIG. 2, FIG. 3, and FIGS. 25 through 28 are plan views illustrating structures of basic macro-cells according to the preferred embodiment of the present invention. In FIG. 1, reference numeral 1a designates a basic macro-cell, 6a denotes a clock signal line formed in the same interconnection layer as power-supply lines 4 and 5, 4a denotes a $V_{DD}$ power-supply line formed interposing the clock signal line 6a together with the power-supply line 4 in an outer area of the clock signal line 6a in the basic macro-cell 1a, and other like reference characters indicate like or corresponding parts in FIG. 20.

Figure 2:
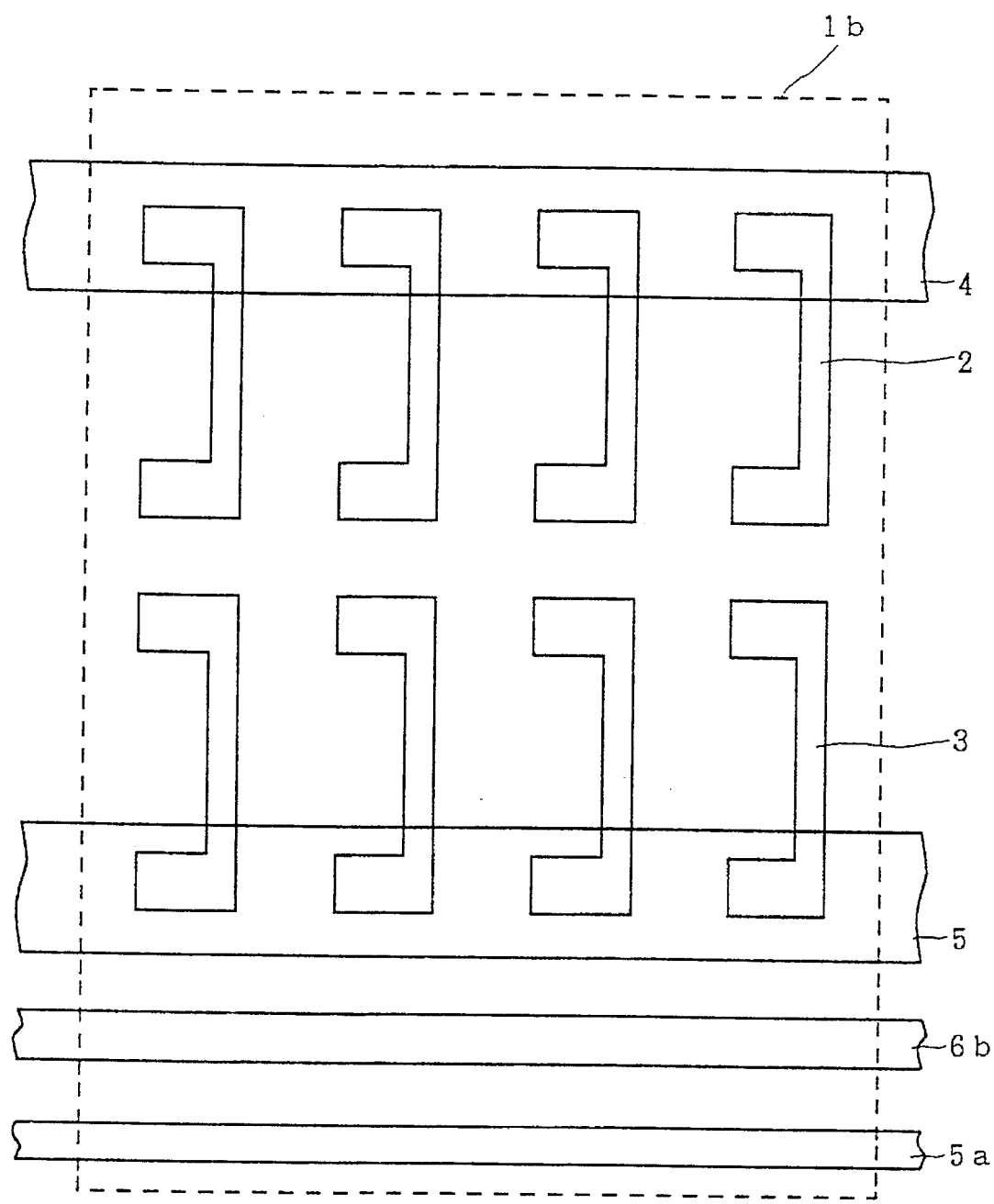
FIG. 2 is a conceptional diagram of a structure of a basic macro-cell of the preferred embodiment according to the present invention.

FIG. 2 is a diagram showing a basic macro-cell in which a clock signal line is interposed between GND power-supply lines, which is different from FIG. 1. In FIG. 2, 1b denotes a basic macro-cell, 5a denotes a GND power-supply line formed in an outer area of the clock signal line 6b interposing the clock signal line 6b together with a power-supply line 5 in the basic macro-cell 1b, and other like reference characters indicate like or corresponding parts in FIG. 20.

Figure 3:
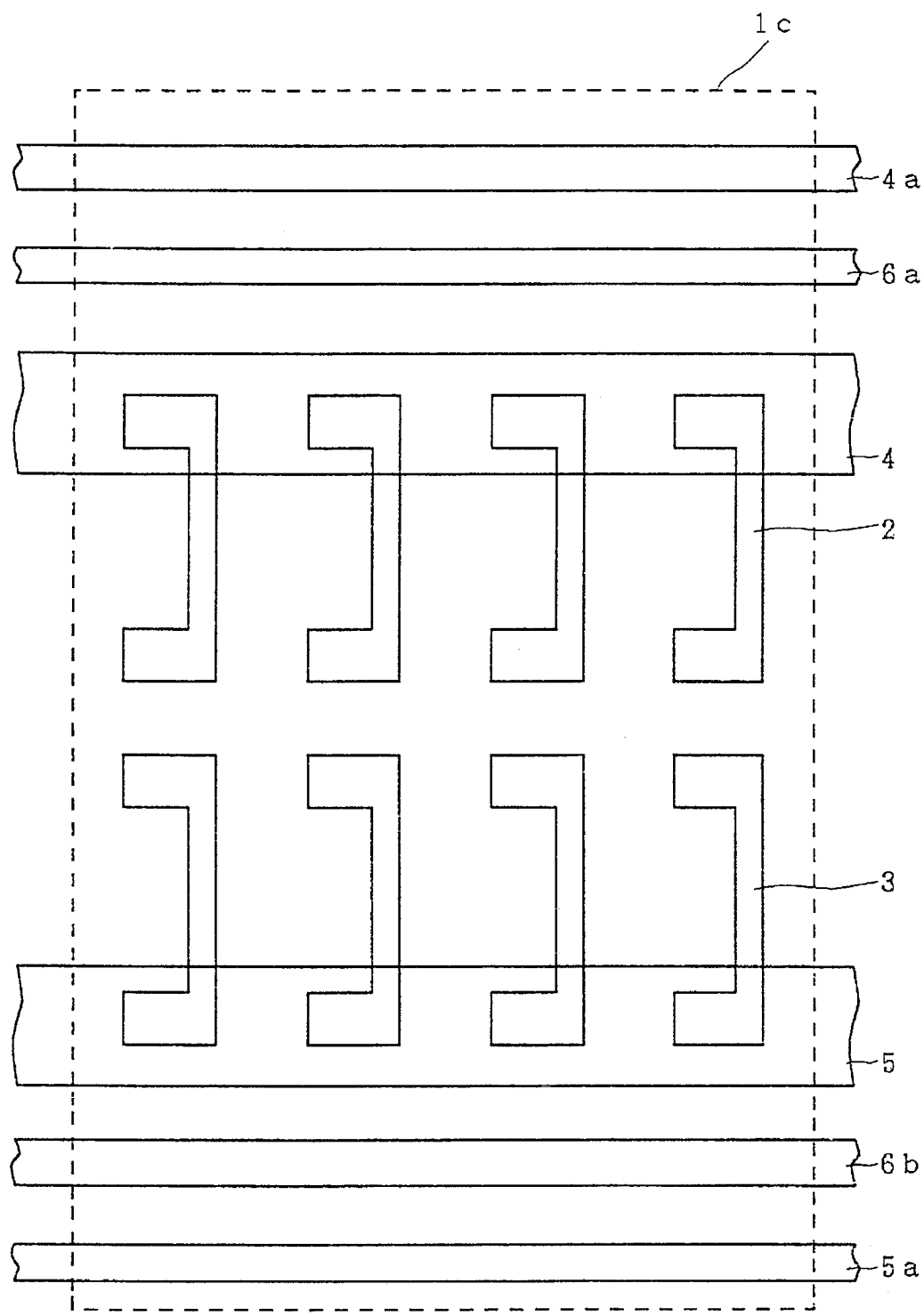
FIG. 3 is a conceptional diagram of a structure of a basic macro-cell of the preferred embodiment according to the present invention.

FIG. 3 is a diagram showing a basic macro-cell in which two clock lines are interposed between $V_{DD}$ power-supply lines and between GND power-supply lines, respectively, which is different from FIGS. 1 and 2. In FIG. 3, 1c denotes a basic macro-cell, 6a and 6b denote clock signal lines formed in the same interconnection layer as power-supply lines 4 and 5, 4a denotes a $V_{DD}$ power-supply line formed interposing the clock signal line 6a together with the power-supply line 4 in an outer area of the clock signal line 6a in the basic macro-cell 1c, 5a denotes a GND power-supply line formed interposing the clock signal line 6b together with the power-supply line 5 in an outer area of the clock signal line 6b in the basic macro-cell 1c, and other like reference characters indicate like or corresponding parts in FIG. 20.

Figure 25:
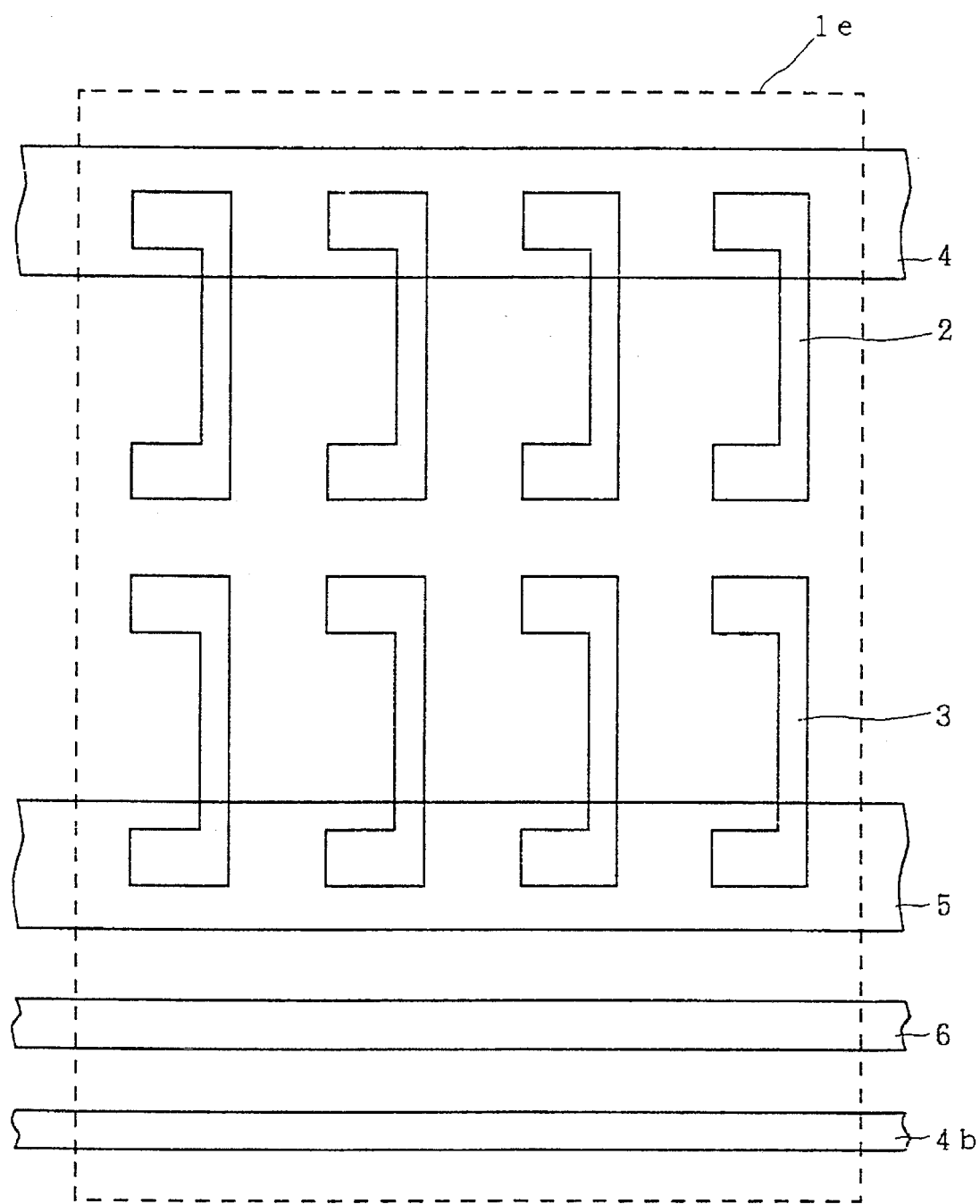
FIG. 25 is a conceptional diagram of a structure of a basic macro-cell of the preferred embodiment according to the present invention.
Figure 26:
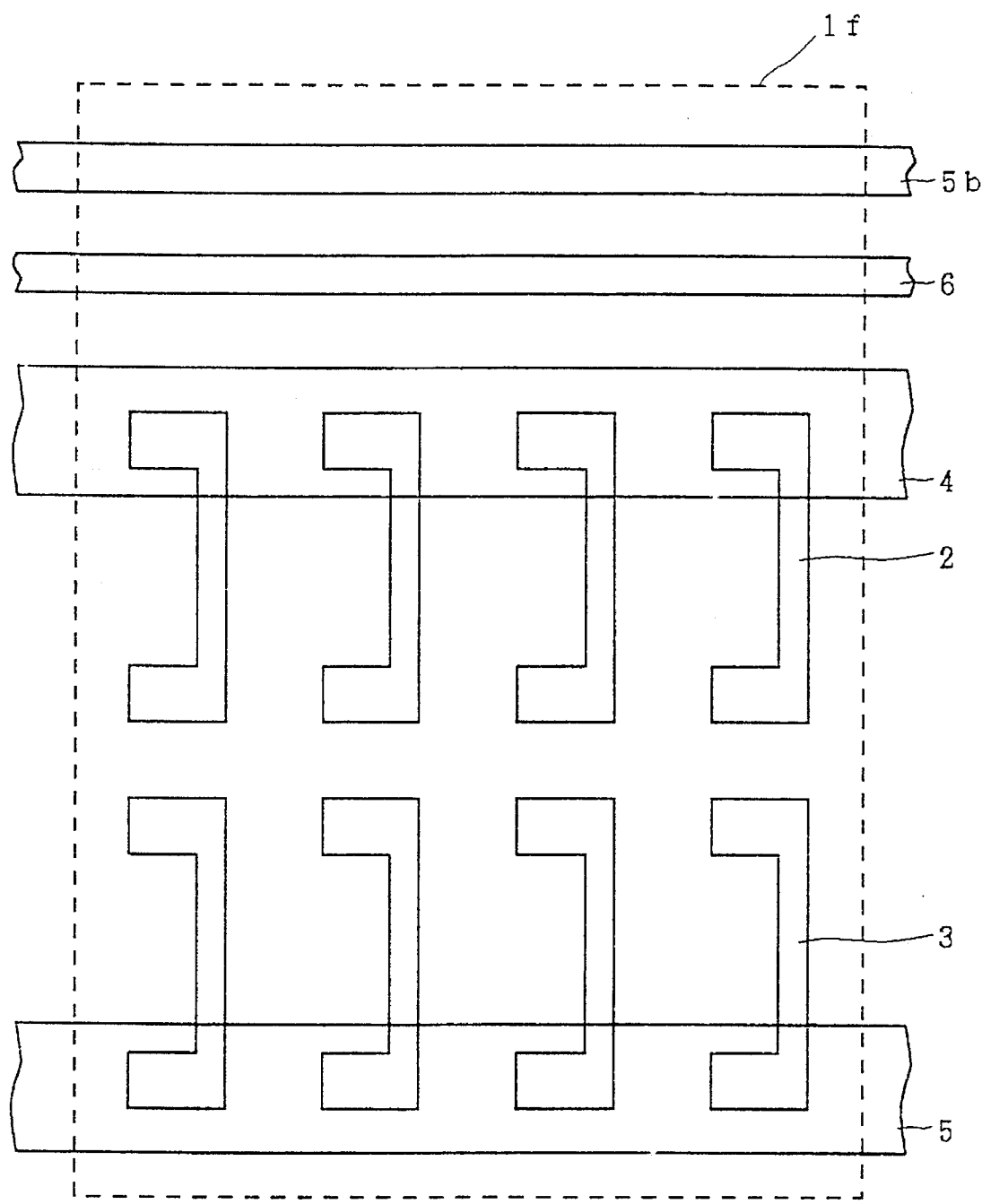
FIG. 26 is a conceptional diagram of a structure of a basic macro-cell of the preferred embodiment according to the present invention.
Figure 27:
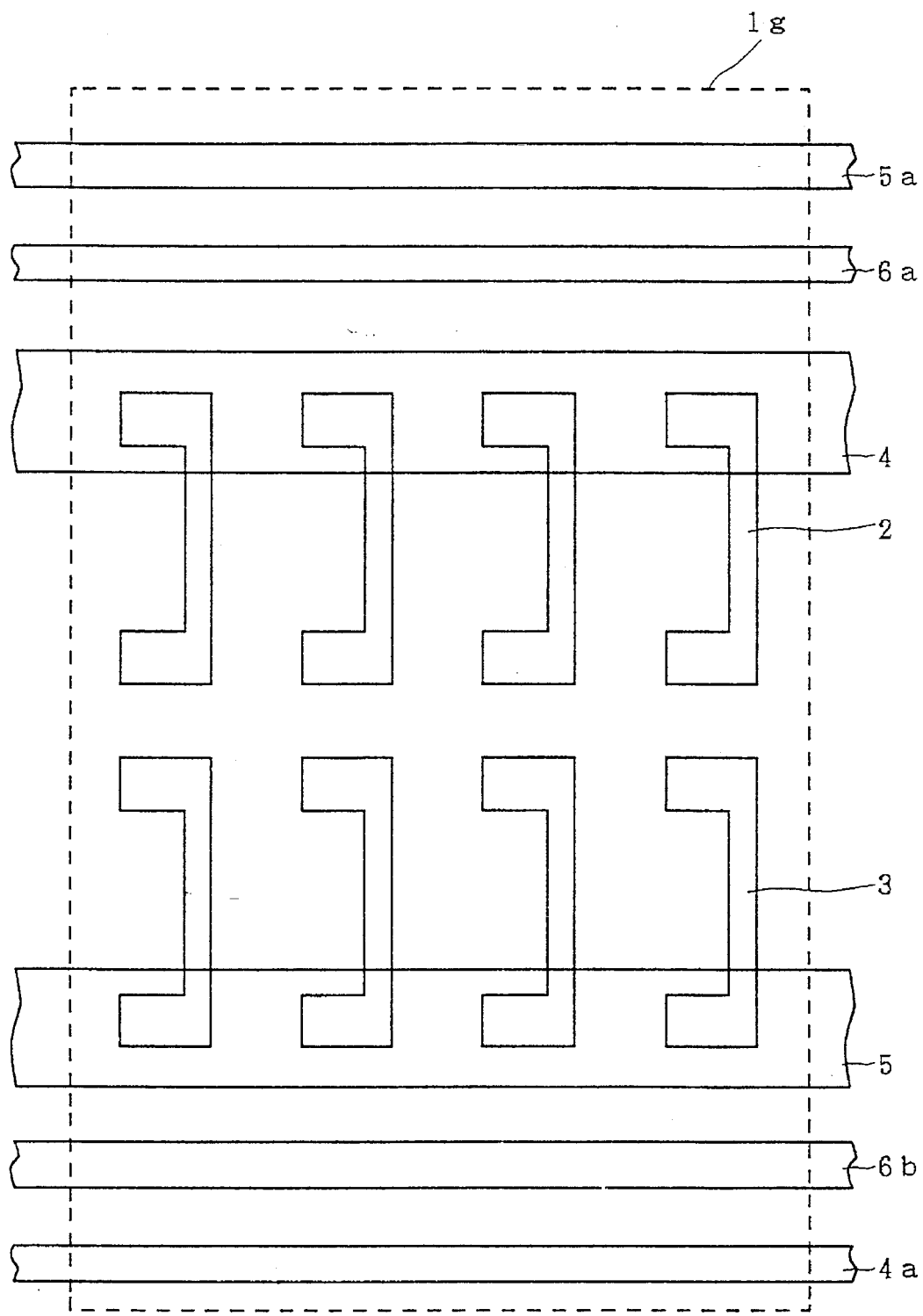
FIG. 27 is a conceptional diagram of a basic macro-cell of the preferred embodiment according to the present invention.

FIGS. 25 through 27 show basic macro-cells in which clock signal lines are interposed between $V_{DD}$ power-supply lines and GND power-supply lines, respectively. In FIGS. 25 through 27, 1e–1g denote basic macro-cells, 4a, 5a, 4b and 5b denote $V_{DD}$ power-supply lines and GND power-supply lines formed interposing the clock signal lines 6 together with GND power-supply lines 5 or $V_{DD}$ power-supply lines 4 in outer areas of the clock signal lines 6 in the basic macro-cells 1c–1g, respectively.

Figure 28:
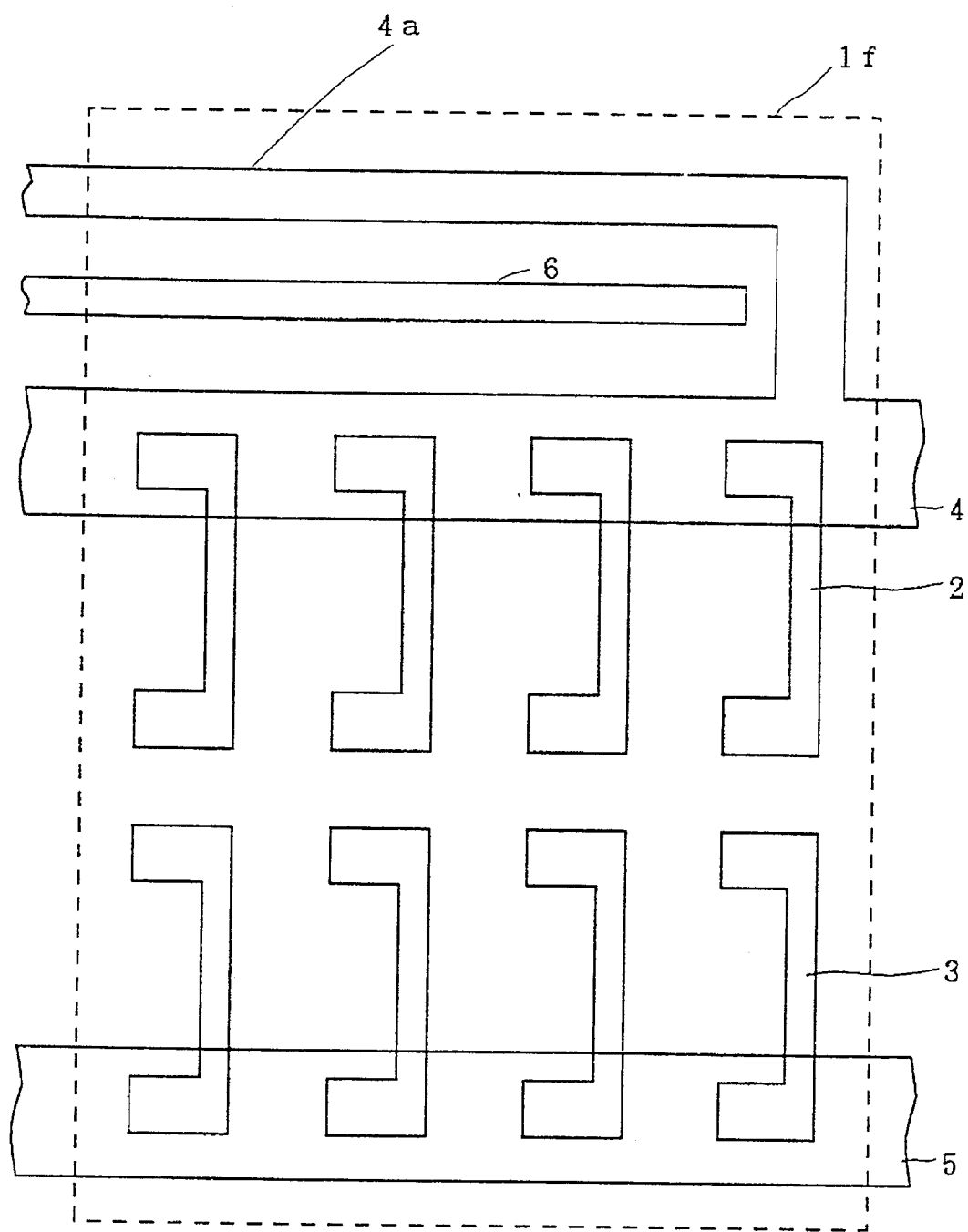
FIG. 28 is a conceptional diagram of a structure of a basic macro-cell of the preferred embodiment according to the present invention.

FIG. 28 is a diagram showing an example in which a set of power-supply lines shielding a clock line are connected to each other in the same interconnection layer.

Figure 4:
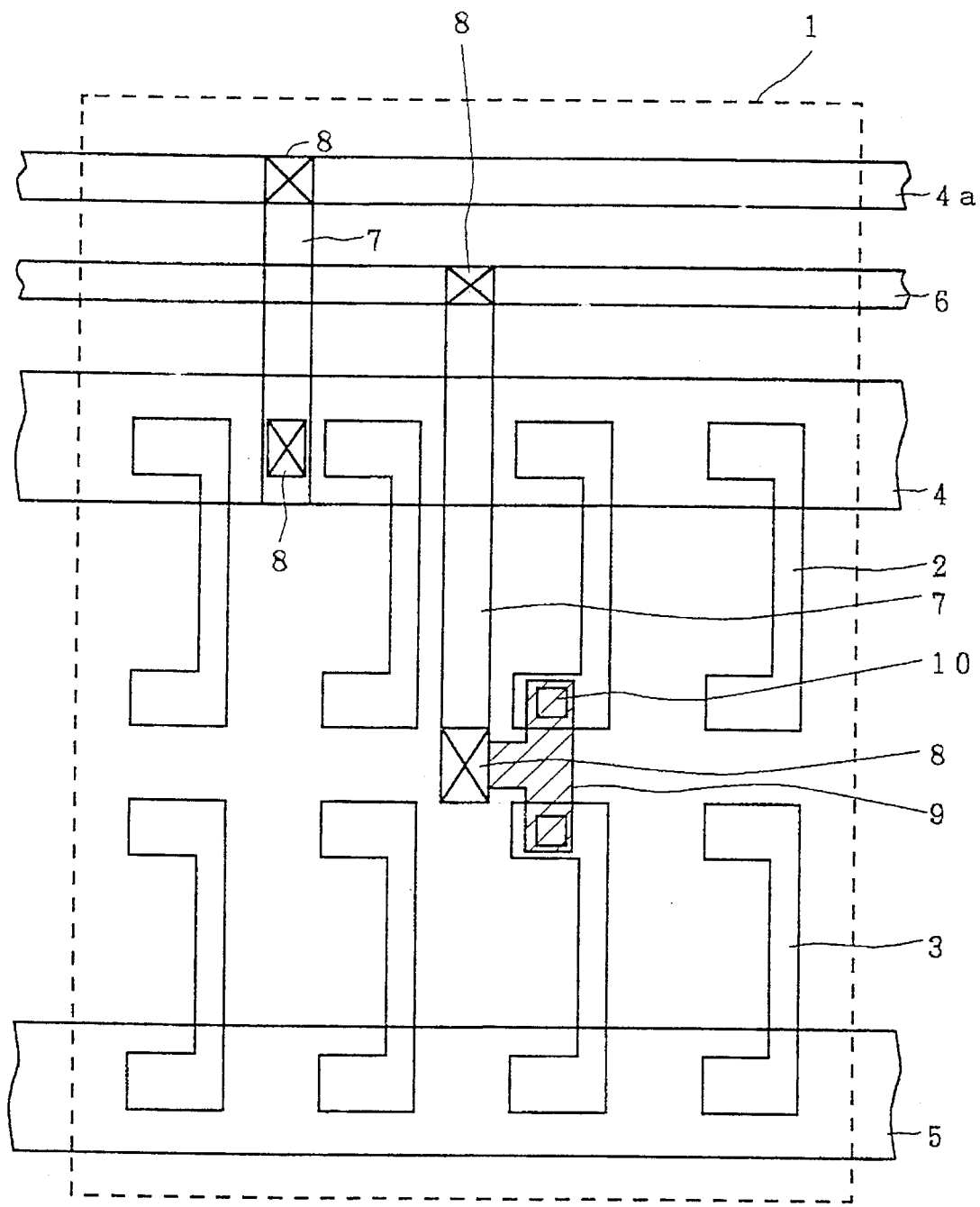
FIG. 4 is a conceptional diagram of a structure of a basic macro-cell of the preferred embodiment according to the present invention.

Next, one example of a method of supplying clock signals to respective transistors in a macro-cell is illustrated in FIG. 4. In the basic macro-cell 1, 7 denotes second layer Al lines, which are formed perpendicularly to a power-supply line 4, a clock signal line 6 and the like in the first layer interconnection. The $V_{DD}$ power-supply lines 4 and 4a and the second layer Al line 7 are connected via through holes 8. The values of potentials of the $V_{DD}$ power-supply lines 4 and 4a can thus be the same regardless of factors such as interconnection resistance. The clock signal line 6 and the second layer Al line 7, and the second layer Al line 7 and the first layer Al line 9 are connected via through holes 8. The first layer Al line 9 is connected to gate electrodes 2 and 3 of transistors via contact holes 10. In this way, clock signals are supplied from the clock signal line 6 to the gate electrodes of transistors.

Figure 5:
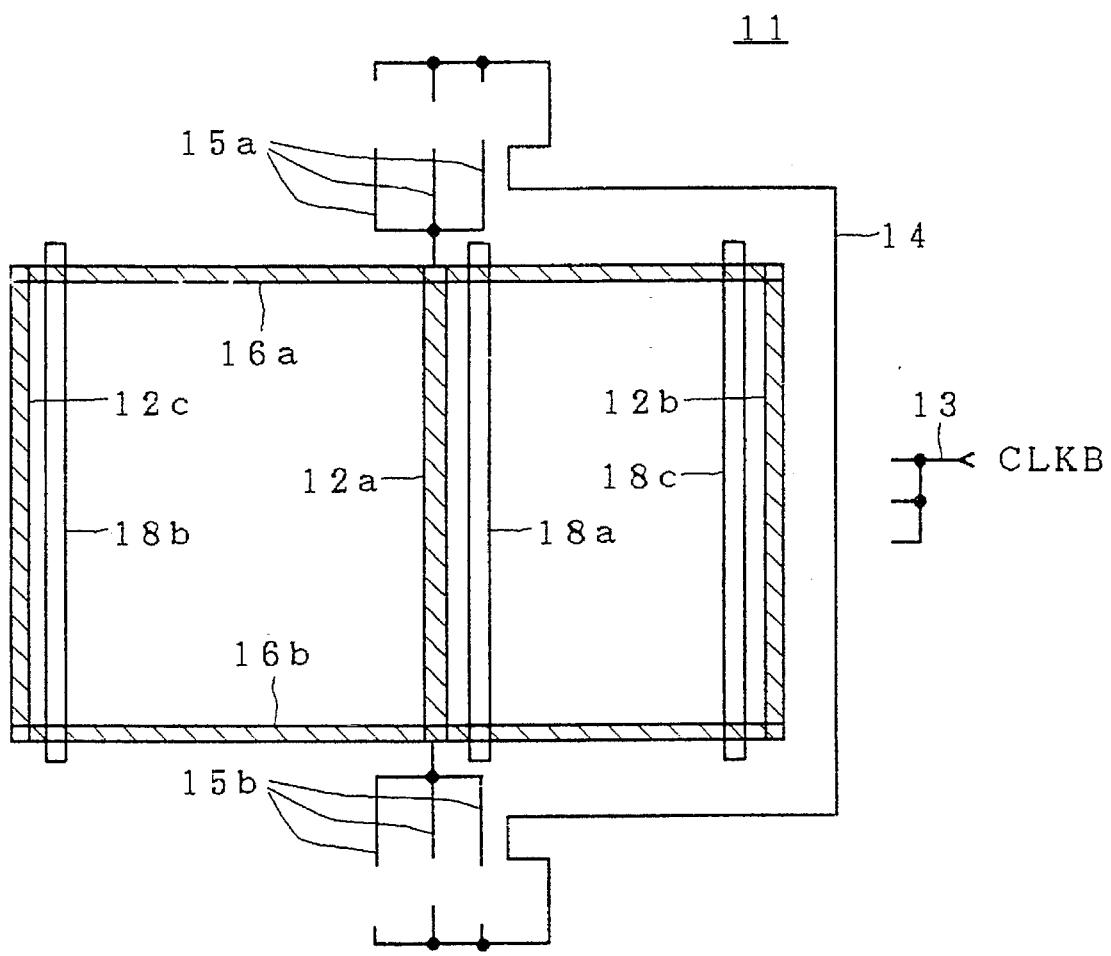
FIG. 5 is a conceptional diagram of a slice cell used in the preferred embodiment according to the present invention.
Figure 6:
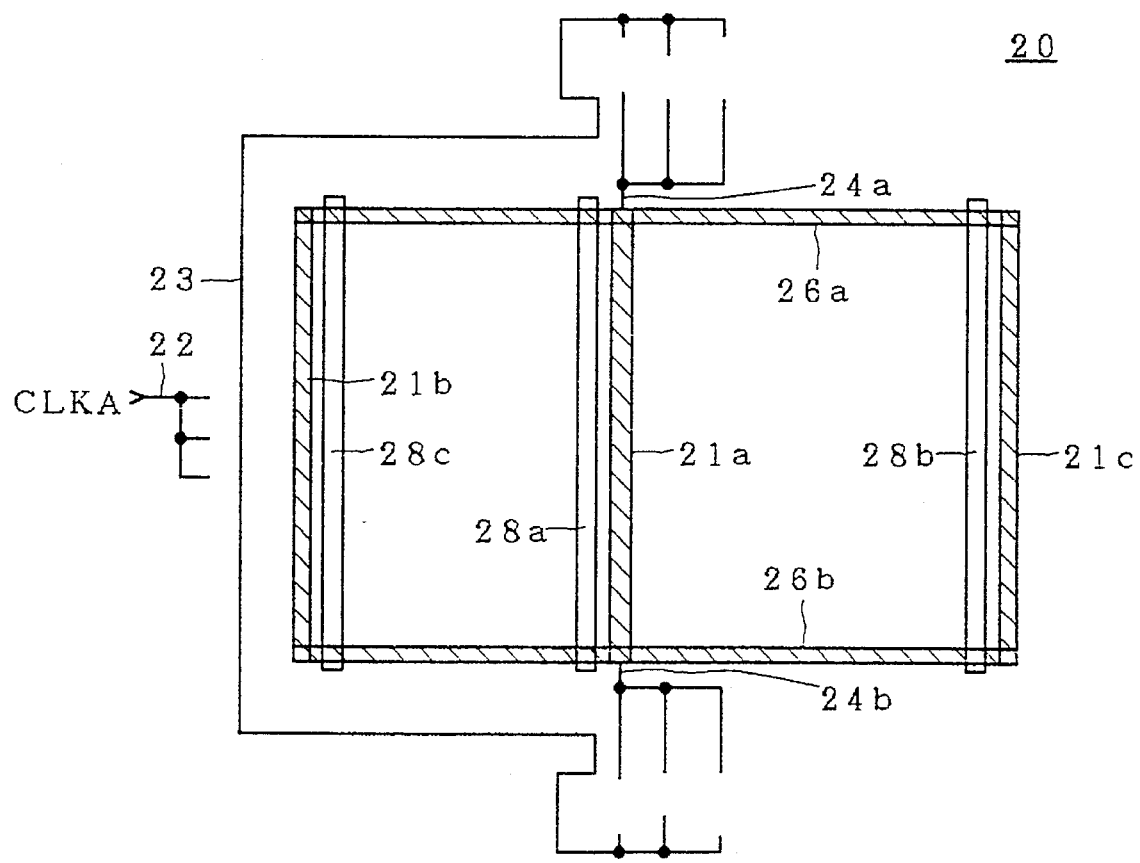
FIG. 6 is a conceptional diagram of a slice cell used in the preferred embodiment according to the present invention.
Figure 14:
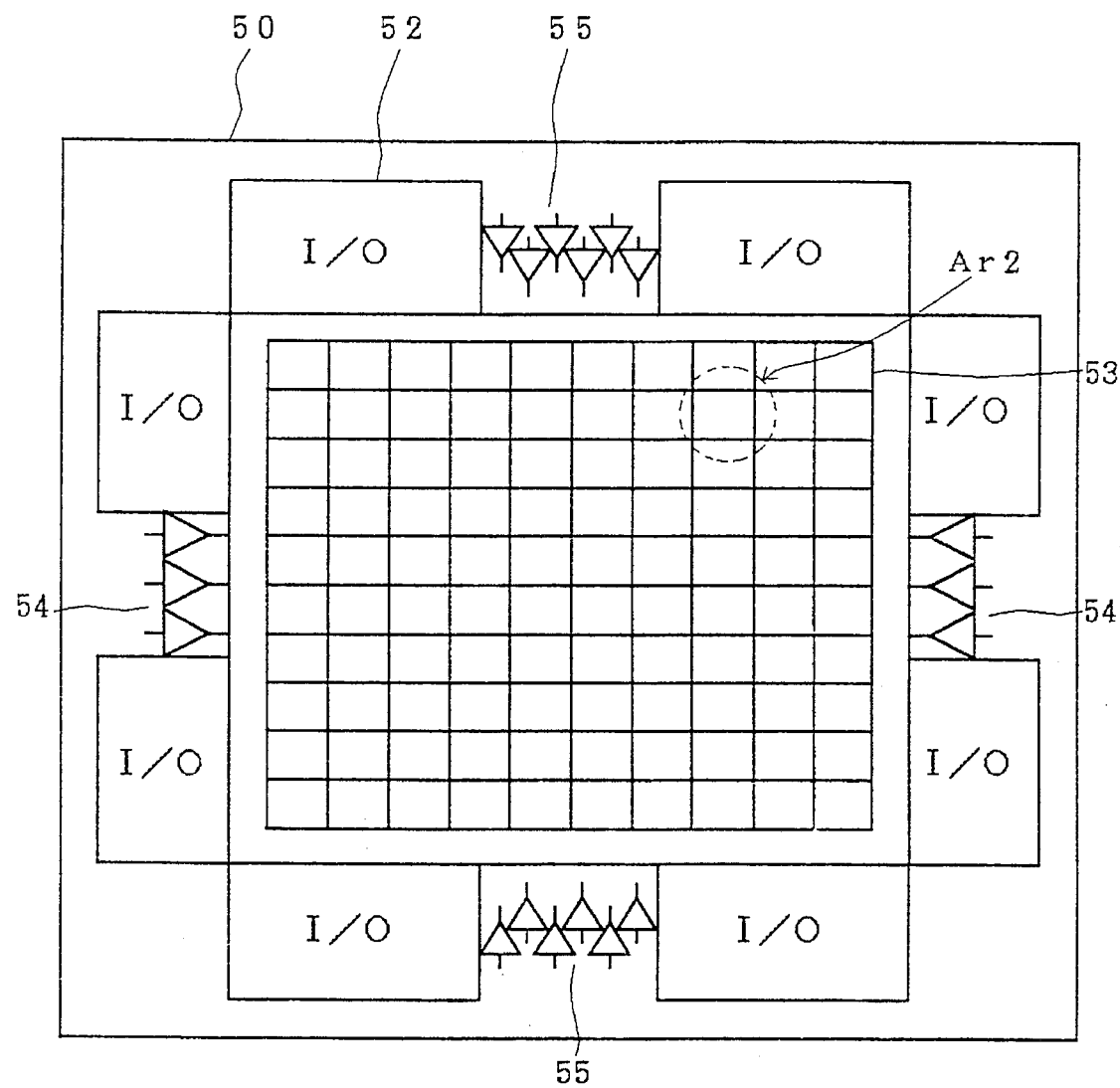
FIG. 14 is a conceptional diagram of one example of a structure of a master chip.
Figure 15:
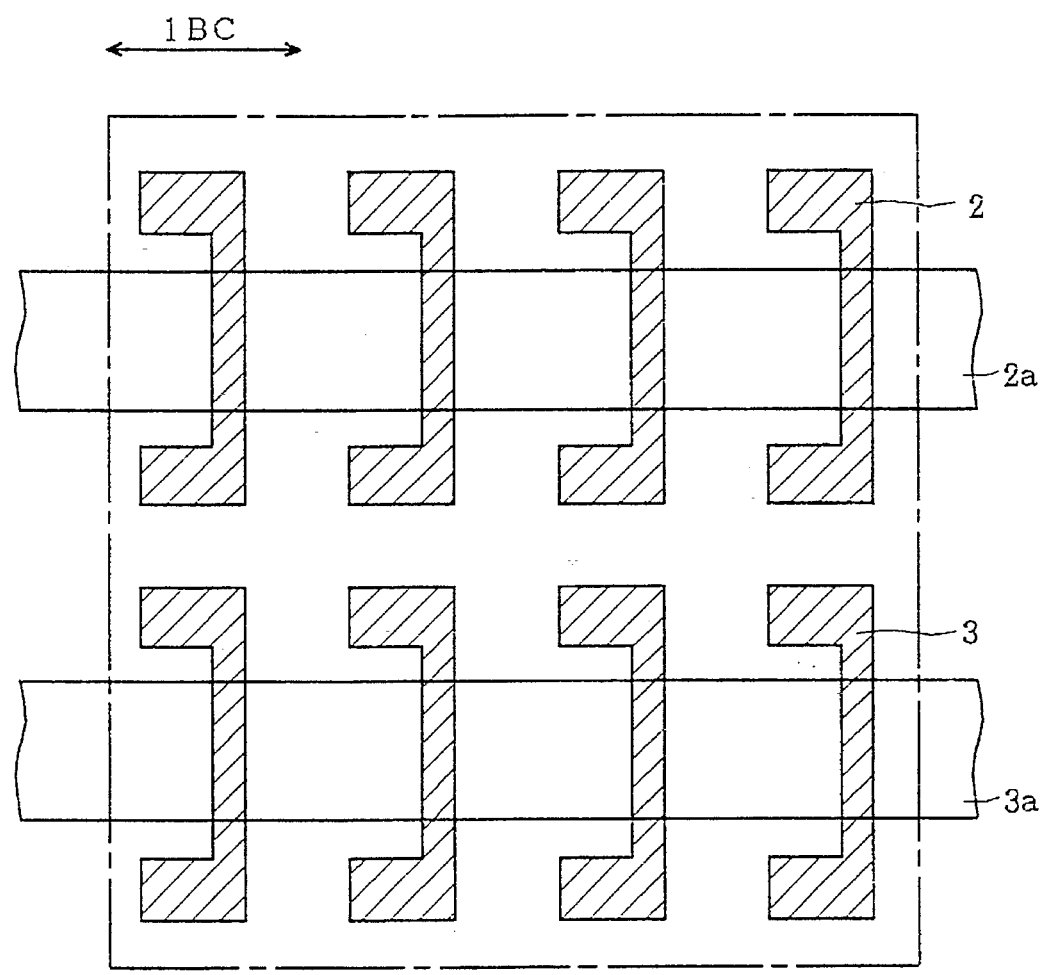
FIG. 15 is a diagram of a structure of an internal gate region of the master chip shown in FIG. 14.
Figure 16:
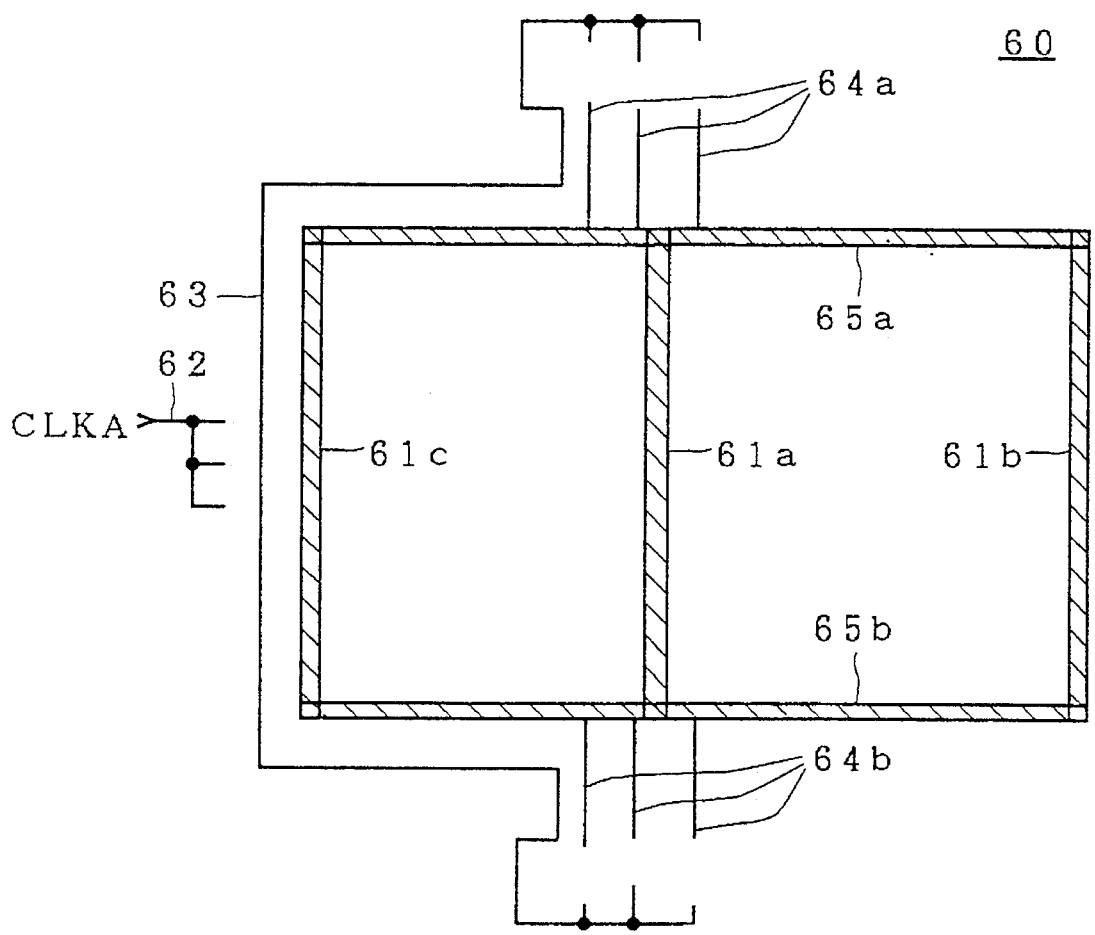
FIG. 16 is a conceptional diagram of a slice cell used in conventional designing of semiconductor integrated circuit devices.
Figure 17:
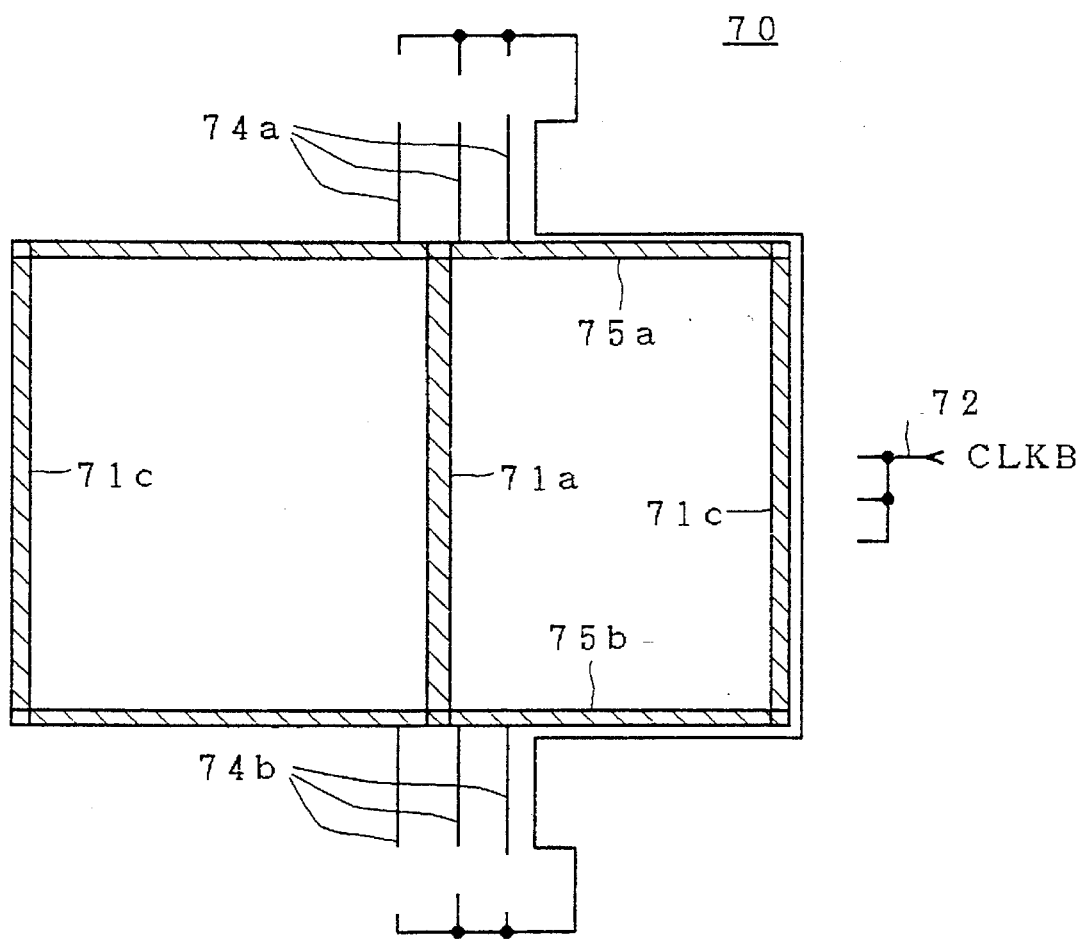
FIG. 17 is a conceptional diagram of a slice cell used in conventional designing of semiconductor integrated circuit devices.
Figure 18:
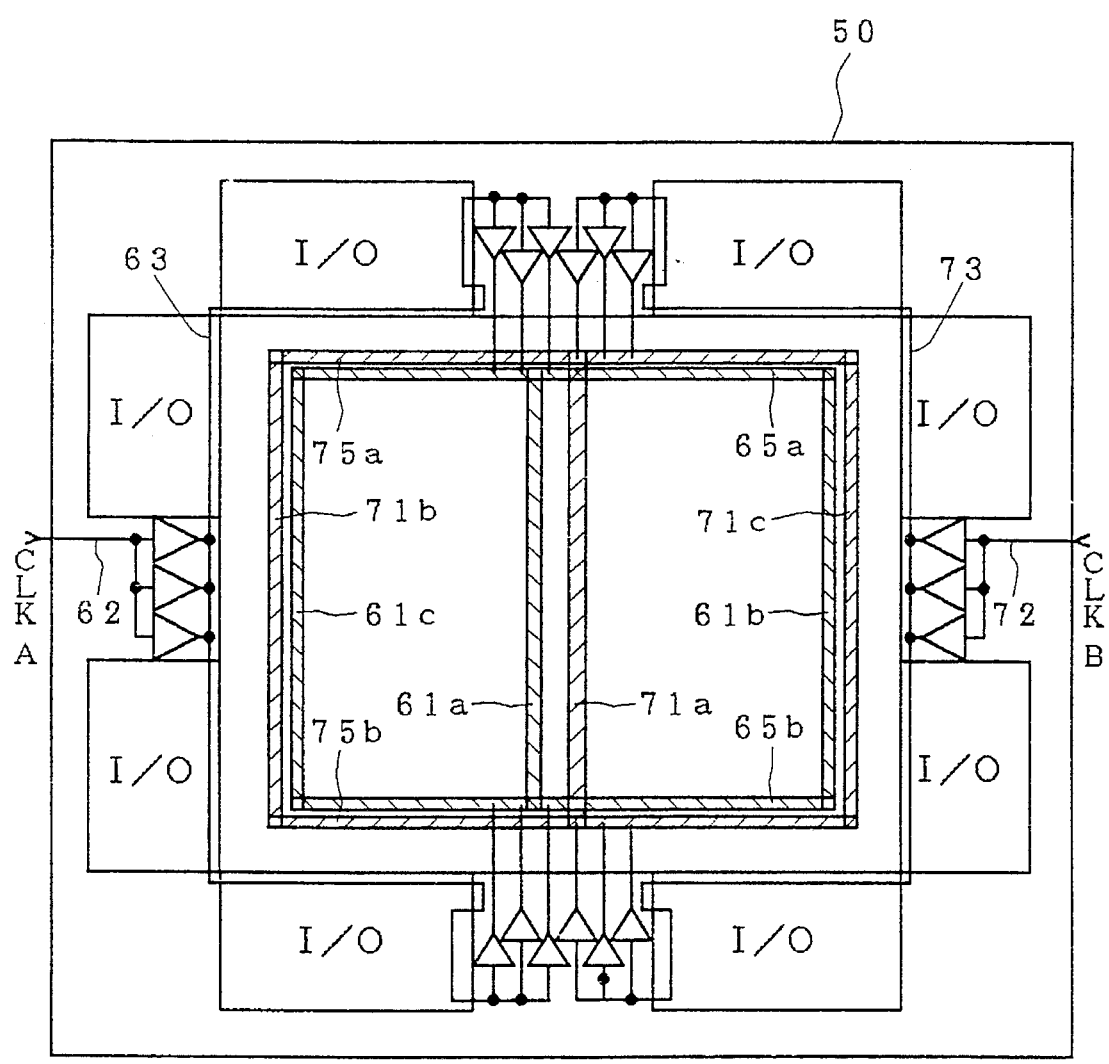
FIG. 18 is a conceptional diagram of a semiconductor integrated circuit device illustrating the slice cells shown in FIGS. 16 and 17 placed on the master chip.
Figure 19:
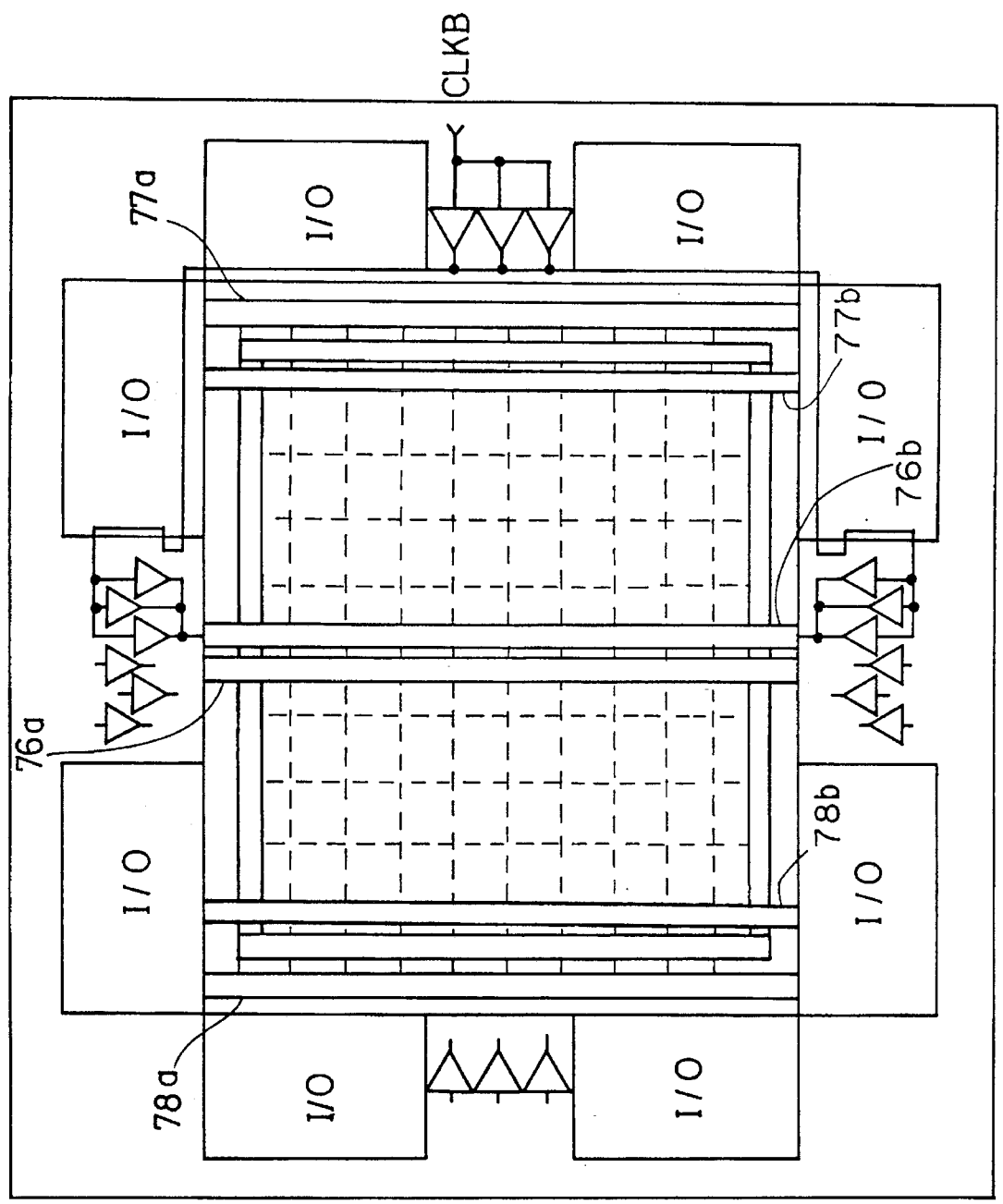
FIG. 19 is a conceptional diagram of a semiconductor integrated circuit device illustrating the master chip shown in FIG. 18 further provided with power-supply lines.

Next, referring to FIGS. 5 through 11, the automatic placement and routing using macro-cells according to the present invention will be described in detail. A master chip the same as that for the conventional semiconductor integrated circuit device shown in FIG. 14 is used. FIGS. 5 and 6 show slice cells for implementing supply of two-phase clock signals to the internal gate region of the master chip. FIG. 5 shows a cell used to form a clock ring for supplying first clock signals CLKB. FIG. 6 shows a cell used to form a clock ring for supplying second clock signals CLKA. In FIGS. 5 and 6, 11 and 20 denote slice cells, 13 and 22 denote predriver input lines for transmitting externally applied clock signals CLKB and CLKA to inputs of predrivers, 14 and 23 denote predriver output lines for transmitting outputs of the predrivers to input terminals of maindrivers, and 15a, 15b, 24a and 24b denote maindriver output lines for transmitting outputs of the maindrivers to clock rings, respectively. 12a–12c and 21a–21c denote second layer Al lines forming clock rings, and 16a–16b and 26a–26b denote first layer Al lines forming clock rings, respectively. The slice cells 11 and 20 are different from the slice cells shown in FIGS. 16 and 17 in that they are provided with power-supply lines 18a–18c and power-supply lines 28a–28c, respectively. The purpose of these provisions is shielding to prevent cross-talk between the clock signal lines 12a–12c and 21a–21c and other signal lines.

Figure 7:
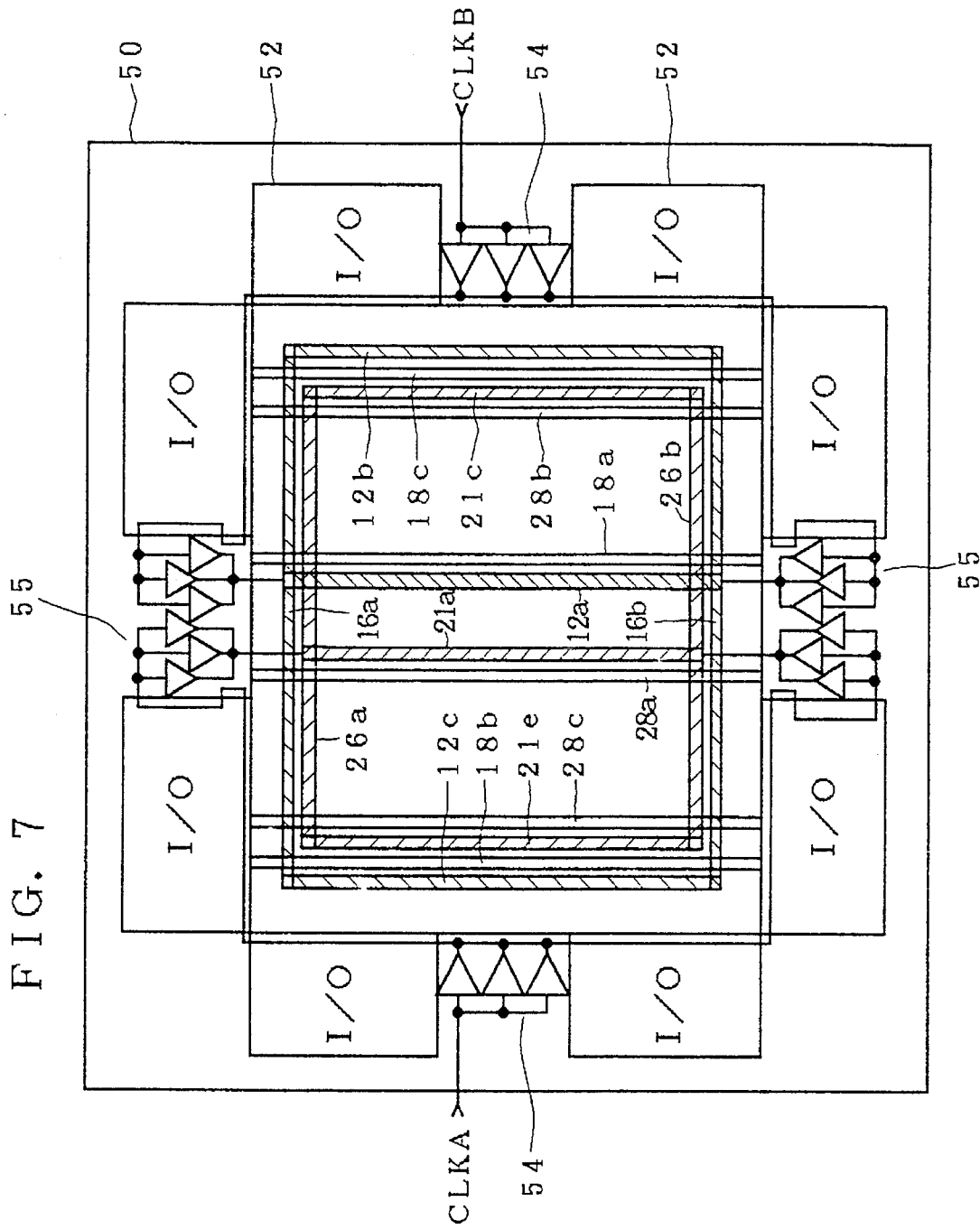
FIG. 7 is a conceptional diagram of a semiconductor integrated circuit device illustrating the slice cells shown in FIGS. 5 and 6 placed on a master chip.

Next, FIG. 7 illustrates the master cell shown in FIG. 14 with the slice cells shown in FIGS. 5 and 6 placed thereon. In FIG. 7, it is a matter of course that the clock rings do not overlap, and the power-supply lines 18a–18c and the power-supply lines 28a–28c do not overlap with the clock rings in the same interconnection layer, either. Two-phase clock signals can be supplied using clock rings similar to the conventional ones, but power-supply lines for shielding can be included in slice cells as shown in FIGS. 5 and 6.

Figure 8:
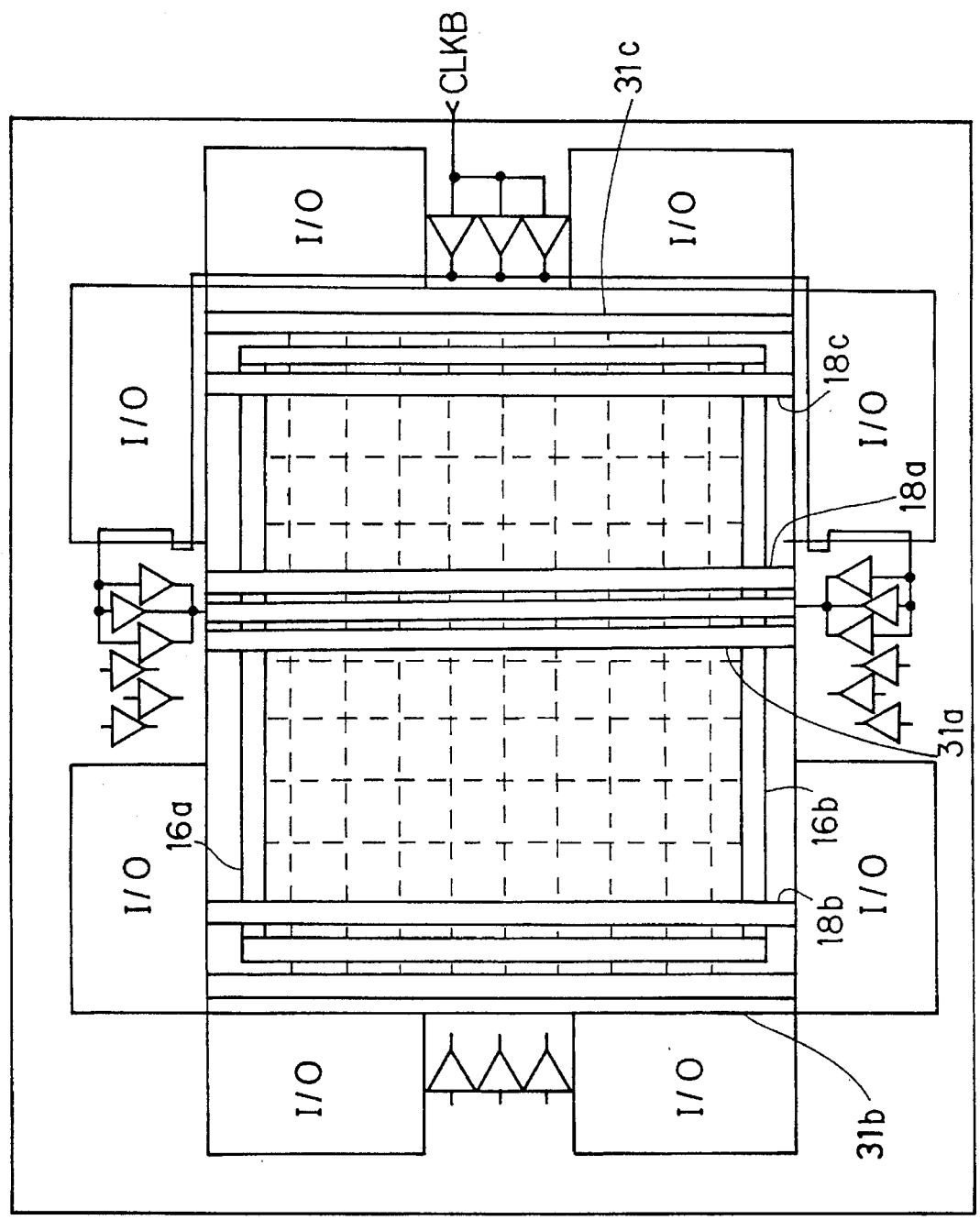
FIG. 8 is a conceptional diagram of a semiconductor integrated circuit device illustrating the master chip shown in FIG. 7 further provided with power-supply lines.

Subsequently, the basic macro-cells are placed and routed to realize desired functions. Description will be given here on the relations of first clock signals CLKB and the basic macro-cells in order to simplify the description. FIG. 8 shows a master chip having power-supply lines 31a–31c with the slice cell shown in FIG. 5 placed thereon. For simplification, GND power-supply lines are not shown here. After routing of the clock ring and the clock driver cells is established, positioning in internal cell rows, that is, in which rows macro-cells are to be provided, is determined. Before providing signal lines, the second layer $V_{DD}$ power-supply lines 31a–31c and the second layer GND power-supply lines 18a–18c are placed in advance as shown in FIG. 8. Areas in which clock signal lines 12a–12c, power-supply lines 31a–31c and the like are placed are treated as areas in which provisions of internal gates and second layer power-supply lines are forbidden in the routing program, so that it does not affect placements of normal signal lines by the routing program. Similarly, the placement areas of the clock signal lines 16a and 16b are secured in advance being inscribed to the I/O buffer regions and treated as areas in which provisions of internal cells and signal lines by first layer metal are forbidden, which dose not affect placements of normal signal lines.

Figure 9:
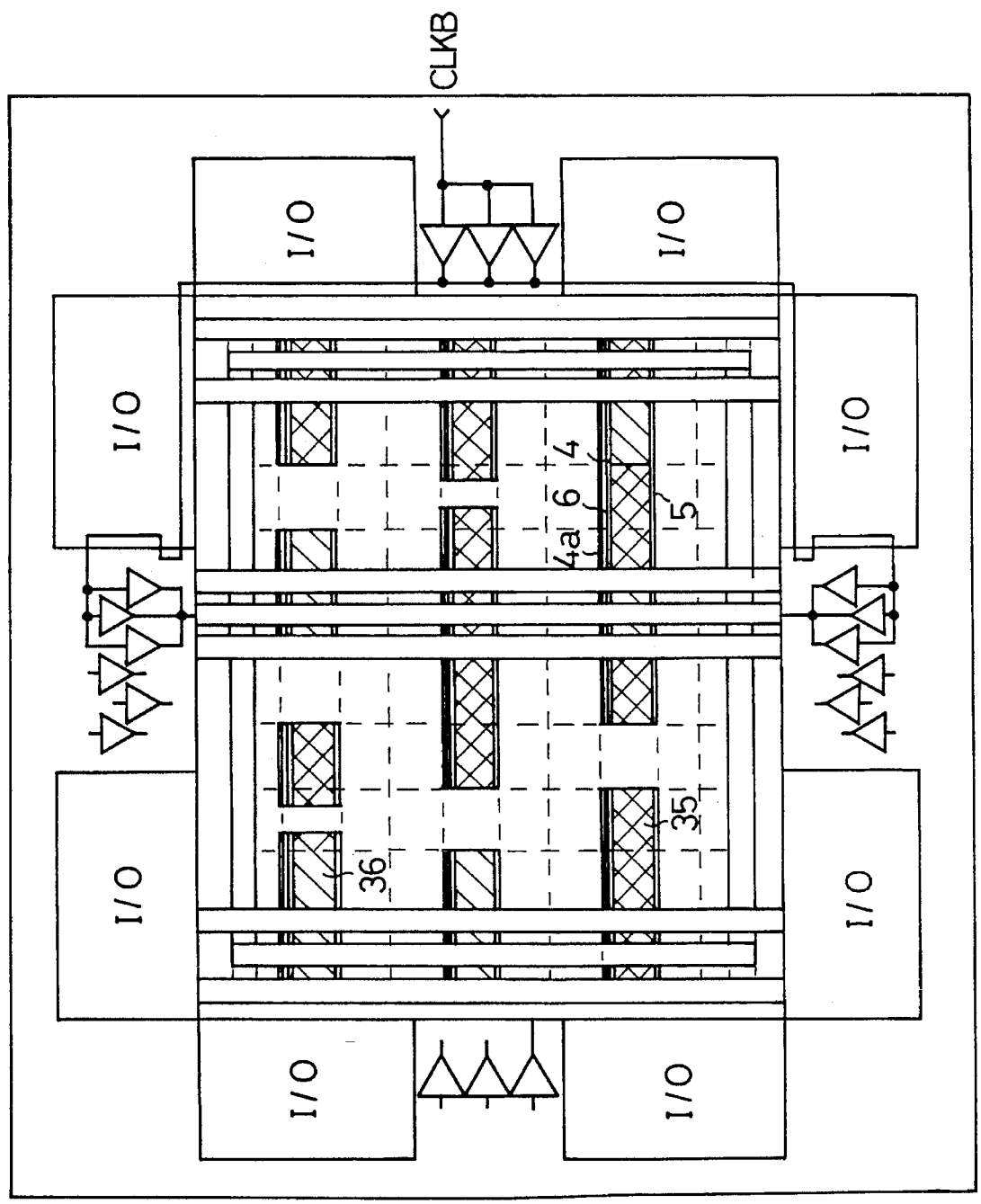
FIG. 9 is a conceptional diagram of a semiconductor integrated circuit device of the master chip shown in FIG. 8 further provided with macro-cells.
Figure 10:
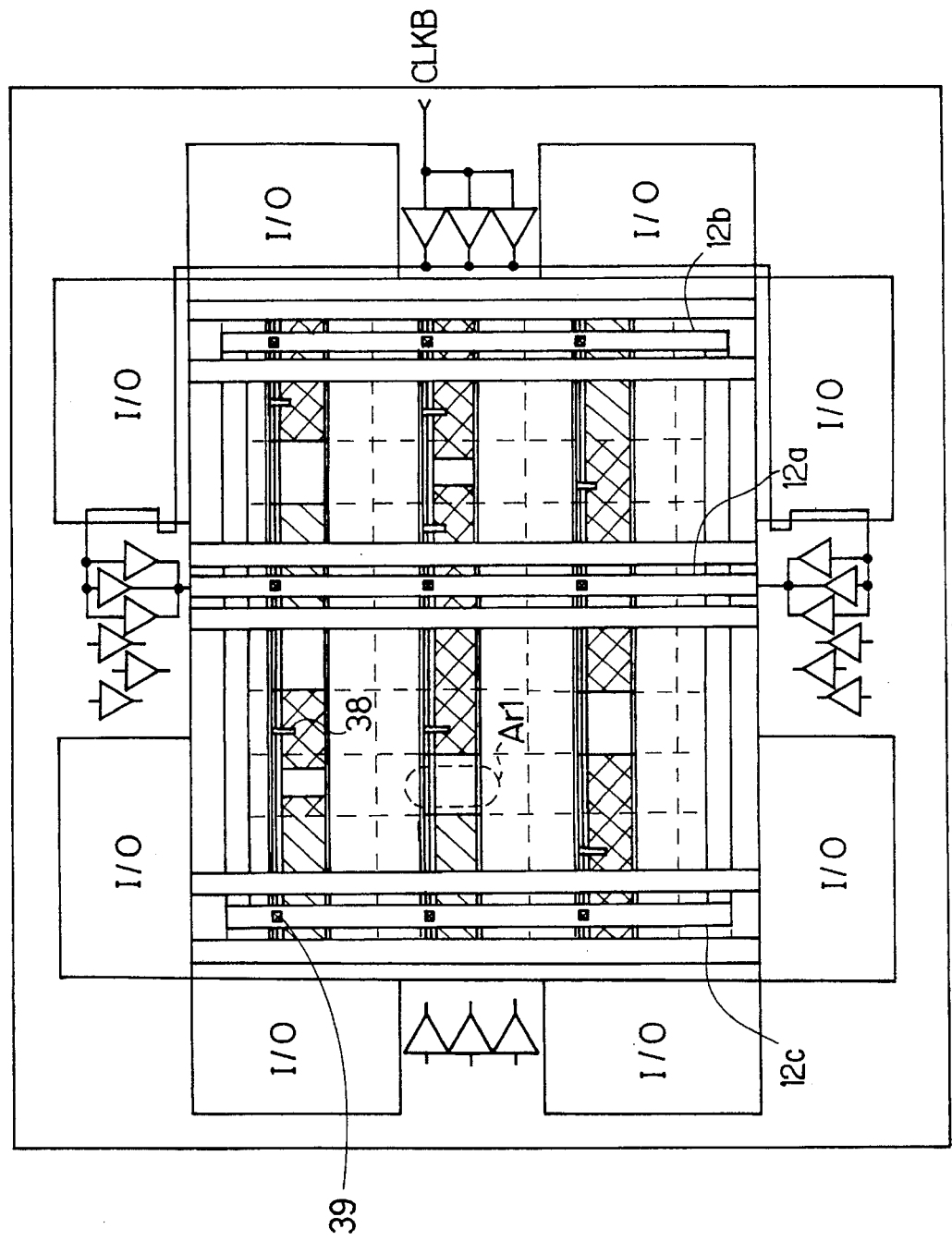
FIG. 10 is a conceptional diagram of a semiconductor integrated circuit device illustrating the master chip shown in FIG. 9 further provided with power-supply lines and clock signal lines of the internal cell rows.

FIG. 9 shows the master chip shown in FIG. 8 with the basic macro-cells shown in FIG. 1, or macro-cells having proposed functions with interconnections on basic macro-cells are placed. In the figure, 35 denotes a sequential circuit which requires supply of the first clock signals CLKB and 36 denotes a combinational circuit which does not require supply of clock signals. When the macro-cells are placed, placements of the power-supply lines 4, 5 and the clock signal lines 6 are almost completed. No macro-cells exist in some areas in the internal cell rows, however, where the power-supply lines 4 and 5, and the clock signal lines 6 are not connected. In order to establish connections in the areas where macro-cells are not connected in a line, macro-cells including only power-supply lines 4 and 5 and clock signal lines 6 having lengths extending from the left end to the right end of the internal gate region 53 are placed on respective macro-cell rows for connecting the power-supply lines 4, 5 and the clock signal lines 6 of the internal cell rows in which internal cells are provided from the left end to the right end thereof. In FIG. 10, such macro-cells are provided. For example, the area Ar1 in FIG. 10 has no connection of transistors and does not serve as an active circuit, but power-supply lines 4, 5, and a clock signal line 6 exist in this area. Accordingly, the power-supply lines 4, 5 and the clock signal line 6 of the internal cell row are connected from the power-supply line 31a on the left end to the power-supply line 31b on the right end without disconnection. At this time, connections with the clock signal lines 6 via second Al lines 38, and connections between the clock signal lines 6 and the clock ring via the through holes 39 are established simultaneously. Note that the second layer Al lines 38 are connected in the shortest distance since they are all connected in the sequential circuits 35.

Figure 13:
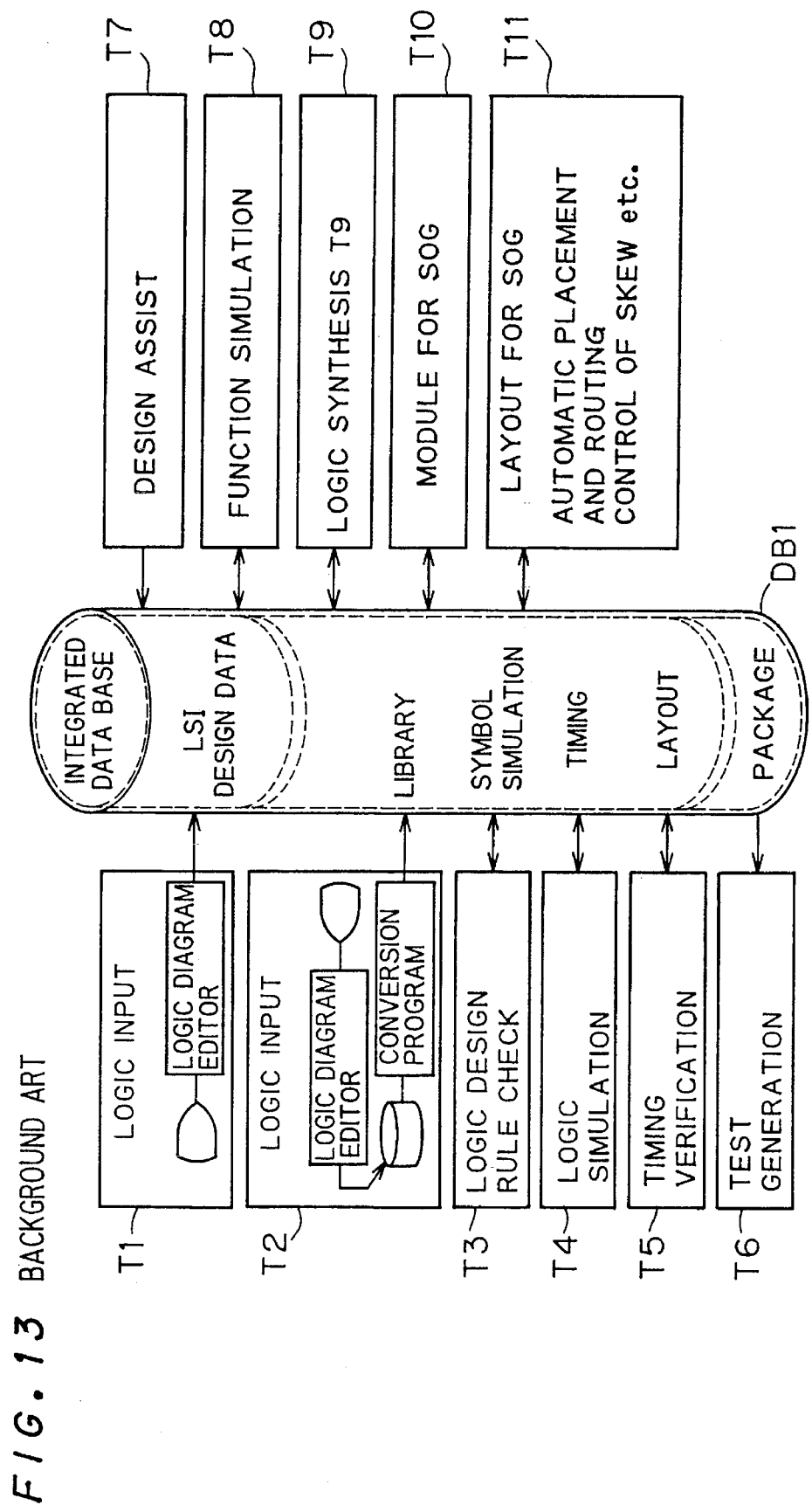
FIG. 13 is a block diagram of a structure of a CAD system performing design of gate arrays.

The basic macro-cells used are entered as library in the data base DB1 shown in FIG. 13 and the layout is performed using the layout tool T11 for SOG. At this time, clock skew is also controlled.

Finally, interconnections for normal signals other than clock signal lines are provided. In the conceptional diagram FIG. 11, signal lines other than clock signal lines are provided. In the figure, the signal lines 40 provided in the interconnection areas are placed in parallel with the clock signal lines 6 in long distances in the areas Ar6 and Ar7, but shielded by the power-supply lines 4a. Therefor, the coupling capacitances between clock signal lines 6 and normal signal lines 40 are extremely small, reducing possibility of occurrence of cross-talk.

In the preferred embodiment described above, the placement and routing are accomplished using the macro-cells 1a shown in FIG. 1, or the same types of macro-cells as basic macro-cells. However, the basic macro-cells 1b–1h shown in FIG. 2, FIG. 3, FIG. 25 and FIG. 26 may be used as basic macro-cells, or they may be used mixed on one master chip.

Figure 11:
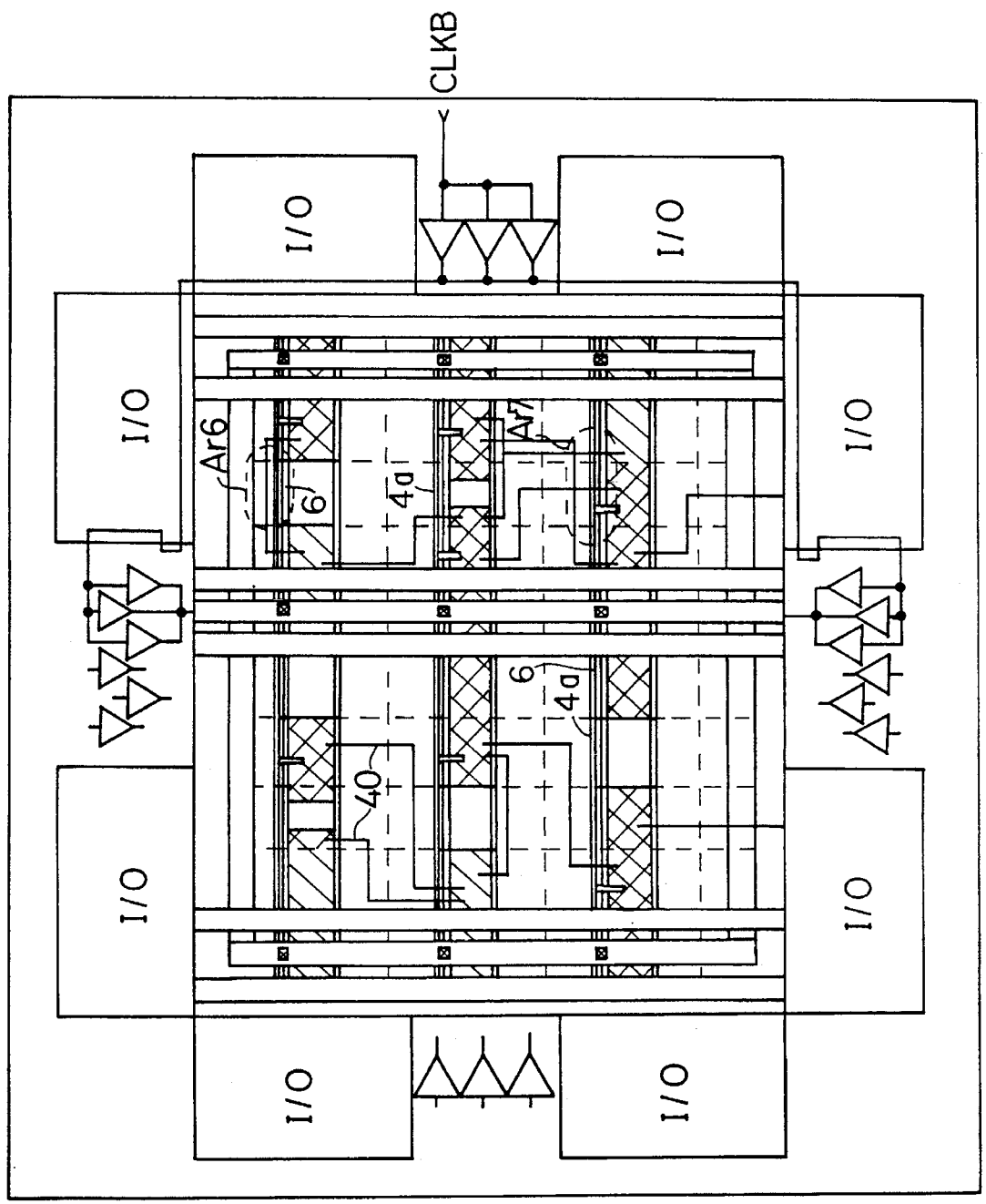
FIG. 11 is a conceptional diagram of a semiconductor integrated circuit device illustrating the master chip shown in FIG. 10 further provided with signal lines.
Figure 12:
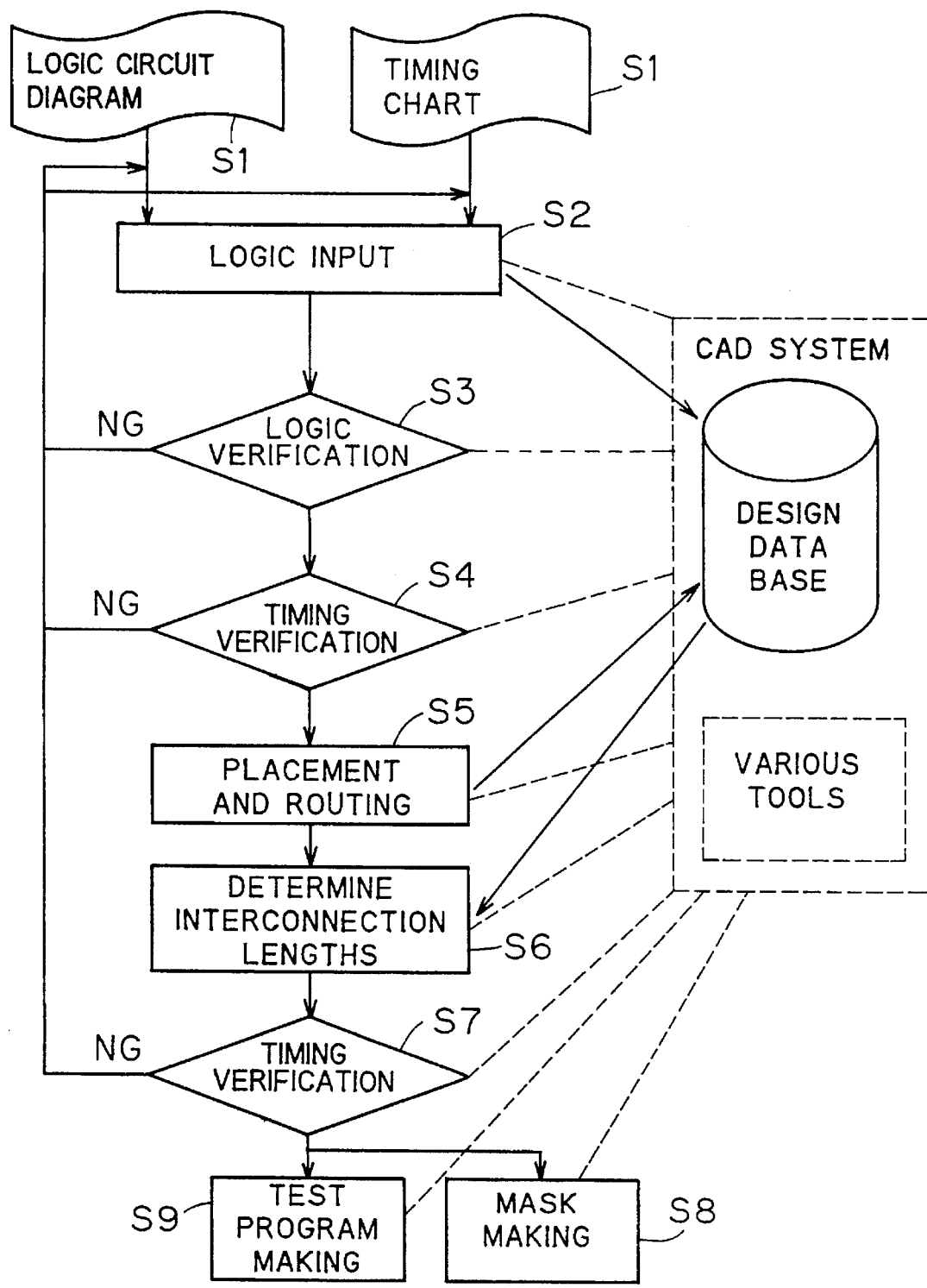
FIG. 12 is a flow chart illustrating outline of design procedures for gate arrays.
Figure 29:
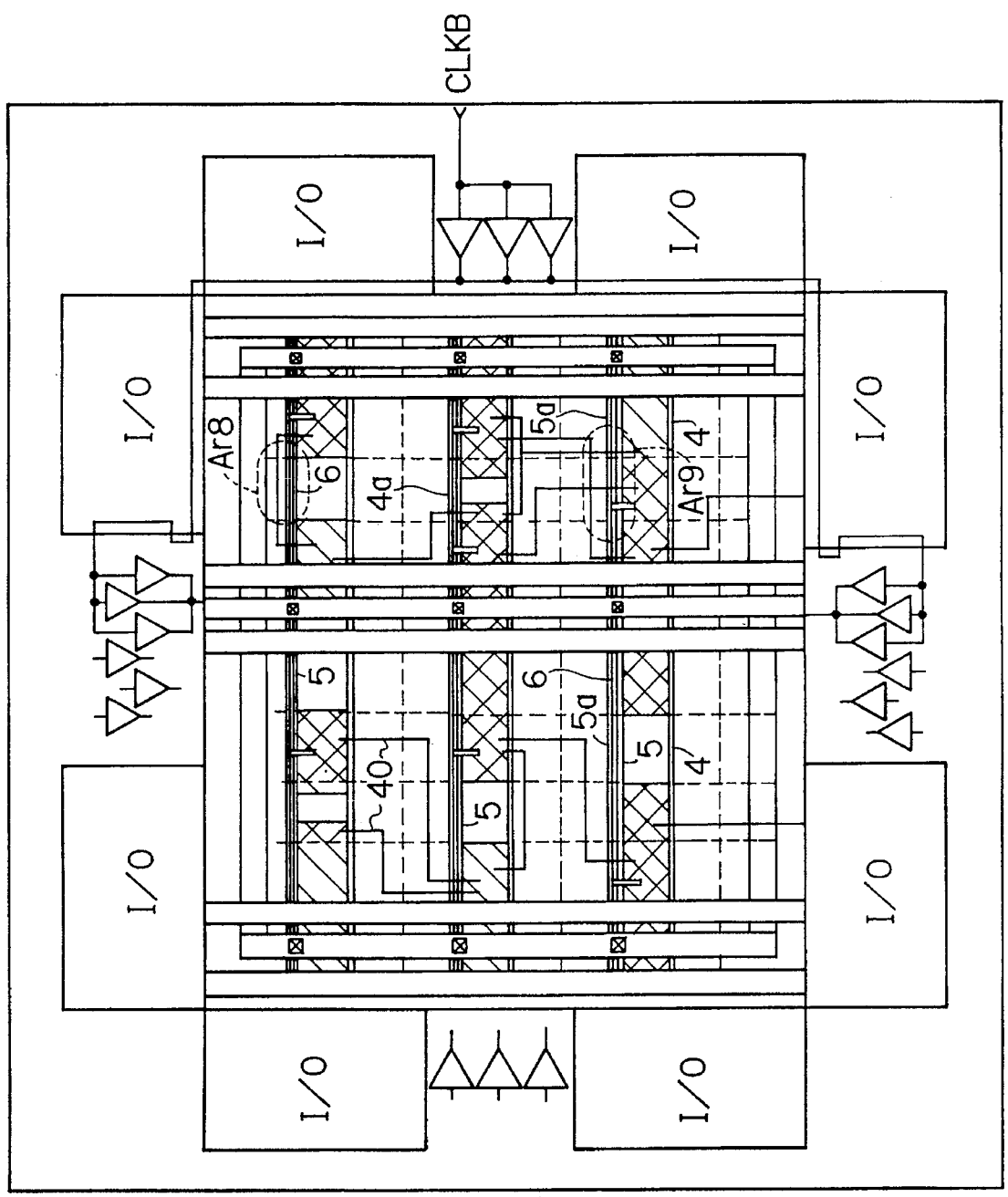
FIG. 29 is a conceptional diagram of the master chip shown in FIG. 7 provided with interconnections including signal lines.

For using above-described basic macro-cells 1a–1g, for example, a change occurs in potential of power-supply lines such as generation of noise pulses of about 1V corresponding to switching of a circuit in a LSI such as a CMOS circuit. Considering a CMOS circuit as an example, when an output of this circuit changes from "L" to "H", negative noise pulses are mainly generated on $V_{DD}$ power-supply lines, and when it changes from "H" to "L", positive noise pulses are mainly generated on GND power-supply lines. Accordingly, when mostly using flip-flop circuits of positive edge trigger type or latches of high enable type, for example, it is advantageous to use such types of basic macro-cells 1a in which shieldings are made by $V_{DD}$ power-supply lines with lower possibility of generation of positive trigger pulses as shown in FIG. 11. On the other hand, it is advantageous to use such types as the basic macro-cells 1b where shieldings are made by GND power-supply lines on which negative trigger pulses are not likely to be caused as shown in FIG. 29 when mostly using flip-flop circuits of negative edge trigger type, latches of low enable type and the like.

While the invention has been shown and described in detail, the foregoing description is in all aspects illustrative and not restrictive. It is therefore understood that numerous modifications and variations can be devised without departing from the scope of the invention.

I claim:

1. A macro-cell of a semiconductor integrated circuit, comprising:

a clock signal line formed in a particular level interconnection layer of multi-level-layer interconnections of said macro-cell, for transmitting a clock signal;

a first power-supply line formed in said particular level interconnection layer to be adjacent to said clock signal line, for supplying said macro-cell with a first power-supply potential;

a second power-supply line for supplying said macro-cell with a second power-supply potential different from said first power-supply potential;

a third power-supply line formed in said particular level interconnection layer to be adjacent to said clock signal line and supplied with either of said first and second power-supply potentials; and wherein said clock signal line is placed between said first power-supply line and said third power-supply line.

2. A semiconductor integrated circuit device having a circuit which is formed by employing a plurality of macro-cells, having data signal lines, and which operates on receiving a supply of a plurality of power-supply potentials and a clock signal, wherein each macro-cell comprises:

a clock signal line formed in a particular level interconnection layer of multi-level-layer interconnections which transmits said clock signal;

a first power-supply line for supplying each macro-cell with a first power-supply potential among said plurality of power-supply potentials;

a second power-supply line formed in said particular level interconnection layer to be adjacent to said clock signal line and supplying each macro-cell with a second power-supply potential among said plurality of power-supply potentials; and a third power-supply line formed in said particular level interconnection layer to be adjacent to said clock signal line and receiving any one power-supply potential among said plurality of power-supply potentials;

wherein none of said data signal lines are placed between said second power-supply line and said third power-supply line in said particular level interconnection layer.

3. The semiconductor integrated circuit device of claim 2, wherein:

said third power-supply line is supplied with said second power-supply potential.

4. The semiconductor integrated circuit device of claim 3, wherein:

said second power-supply potential is higher than said first power-supply potential.

5. The semiconductor integrated circuit device of claim 4, wherein:

at least one of said plurality of macro-cells includes an element which operates when an level of an inputted signal changes from a low level to a high level.

6. The semiconductor integrated circuit device of claim 4, wherein the circuit formed by employing at least one of said plurality of macro-cells includes an element which operates when a level of an inputted signal is at a higher level.

7. The semiconductor integrated circuit of claim 3, wherein said second power-supply potential is lower than said first power-supply potential.

8. The semiconductor integrated circuit device of claim 7, wherein the circuit formed by employing at least one of said plurality of macro-cells includes an element which operates when a level of an input signal changes from a higher level to a low level.

9. The semiconductor integrated circuit device of claim 7, wherein the circuit formed by employing at least one of said plurality of macro-cells includes an element which operates when a level of an input signal is at a lower level.

10. The semiconductor integrated circuit device of claim 3, wherein certain macro-cells comprise a connecting line which is formed in any one interconnection layer of said multi-level-layer interconnections different from said particular level interconnection layer and electrically connects said second power-supply line and said third power-supply line.

11. The semiconductor integrated circuit device of claim 3, wherein certain macro-cells comprise a connecting line which is formed in said particular level interconnection layer and electrically connects said second power-supply line and said third power-supply line.

12. The semiconductor integrated circuit device of claim 2, wherein said second power-supply line and said third-power supply line have different line widths.

13. The semiconductor integrated circuit device of claim 2, wherein:

said plurality of macro cells includes first and second macro-cells which are used to construct desired first and second circuits, respectively; and said semiconductor integrated circuit device further comprising:

a third macro-cell formed between said first and second macro cells, for wiring said first to third power-supply lines and said clock signal line of said first circuit to said first to third power-supply lines and said clock signal line of said second circuit, respectively.

14. The semiconductor integrated circuit device of claim 2, wherein at least one of said plurality of macro-cells includes a connecting line for electrically connecting between said gate electrodes of a pair of transistors, consisting of a PMOS transistor and an NMOS transistor, and said clock signal line.

15. The semiconductor integrated circuit device of claim 2, wherein said semiconductor integrated circuit device is constructed by a sea-of-gates array.

16. The semiconductor integrated circuit device of claim 2, wherein at least one of said plurality of macro-cells includes a connecting line for electrically connecting a gate electrode of a transistor thereof and said clock signal line.

17. The semiconductor integrated circuit device of claim 2, wherein said plurality of macro-cells are placed on a plurality of internal cell rows in a row direction.

18. The semiconductor integrated circuit device of claim 17, wherein:

said clock signal line, said second power-supply line and said third power-supply line are placed in parallel in said row direction.

* * * * *